US009515776B2

(12) United States Patent
Shelby et al.

(10) Patent No.: US 9,515,776 B2
(45) Date of Patent: Dec. 6, 2016

(54) WIRELESS TRANSMISSION OF MULTIMEDIA STREAMS WHICH USES CONTROL INFORMATION TO ASSOCIATE ERROR CORRECTION CODING WITH AN AUDIOVISUAL STREAM

(71) Applicant: Coherent Logix Incorporated, Austin, TX (US)

(72) Inventors: Kevin A. Shelby, Austin, TX (US);
Peter J. Nysen, San Jose, CA (US);
Michael B. Doerr, Dripping Springs, TX (US)

(73) Assignee: Coherent Logix, Incorporated, Austin, TX (US)

( * ) Notice: Subject to any disclaimer, the term of this patent is extended or adjusted under 35 U.S.C. 154(b) by 1105 days.

(21) Appl. No.: 13/629,844

(22) Filed: Sep. 28, 2012

(65) Prior Publication Data
US 2013/0031588 A1 Jan. 31, 2013

Related U.S. Application Data

(63) Continuation of application No. 12/472,892, filed on May 27, 2009, now Pat. No. 8,332,896, which is a
(Continued)

(51) Int. Cl.
*H04N 7/173* (2011.01)
*H04L 1/00* (2006.01)
(Continued)

(52) U.S. Cl.
CPC ............ *H04L 1/0059* (2013.01); *H03M 13/29* (2013.01); *H03M 13/2906* (2013.01);
(Continued)

(58) Field of Classification Search
CPC ............ H04N 21/4381; H04N 21/4382; H04N 21/2383; H04N 21/41407; H04N 21/6131; H04N 21/6437; H03M 13/1102; H03M 13/2732; H03M 13/29; H03M 13/2906; H03M 13/22936; H03M 13/2957; H03M 13/6583; H04L 1/0059; H04L 1/0069; H04L 1/0075; H04L 1/0083; H04L 1/04; H04L 1/06; H04L 1/08; H04L 1/4076; H04L 65/607
(Continued)

(56) References Cited

U.S. PATENT DOCUMENTS 5,923,642 A * 7/1999 Young ................ H04B 7/18513
348/E7.093
6,125,147 A 9/2000 Florencio et al.
(Continued)

FOREIGN PATENT DOCUMENTS

WO 0203678 1/2002
WO 2007046677 4/2007
WO 2007138283 12/2007

OTHER PUBLICATIONS

International Search Report and Written Opinion, PCT/US2009/045650, mailed Dec. 8, 2009, 16 pages.
(Continued)

*Primary Examiner* — Pankaj Kumar
*Assistant Examiner* — Reuben M Brown
(74) *Attorney, Agent, or Firm* — Meyertons Hood Kivlin Kowert & Goetzel, P.C.; Jeffrey C. Hood

(57) ABSTRACT

A system and method for wirelessly transmitting audiovisual information. A first plurality of packets including audiovisual information may be generated. A second plurality of packets including error correction coding information for the audiovisual information may be generated. Control information for associating the error correction coding information with the audiovisual information may be generated, and a third plurality of packets including the control information
(Continued)

may also be generated. The plurality of packets, including the first, second, and third pluralities of packets, may be transmitted to a mobile device in a wireless manner. The control information may inform the mobile device of the association of the first error correction coding information with the audiovisual information.

20 Claims, 24 Drawing Sheets

Related U.S. Application Data continuation-in-part of application No. 12/167,708, filed on Jul. 3, 2008, now Pat. No. 8,151,305.

(60) Provisional application No. 60/948,185, filed on Jul. 5, 2007, provisional application No. 60/958,585, filed on Jul. 5, 2007, provisional application No. 60/999,039, filed on Oct. 14, 2007, provisional application No. 61/130,344, filed on May 31, 2008.

(51) Int. Cl.
*H03M 13/29* (2006.01)
*H03M 13/00* (2006.01)
*H04L 1/04* (2006.01)
*H04L 1/06* (2006.01)
*H04L 1/08* (2006.01)
*H04N 21/2381* (2011.01)
*H04N 21/2383* (2011.01)
*H04N 21/414* (2011.01)
*H04N 21/438* (2011.01)
*H04N 21/61* (2011.01)
*H04N 21/6437* (2011.01)
*H04L 29/06* (2006.01)
*H04N 7/16* (2011.01)
*H03M 13/11* (2006.01)
*H03M 13/27* (2006.01)

(52) U.S. Cl.
CPC ... *H03M 13/2909* (2013.01); *H03M 13/2957* (2013.01); *H03M 13/6583* (2013.01); *H04L 1/0069* (2013.01); *H04L 1/0075* (2013.01); *H04L 1/0083* (2013.01); *H04L 1/04* (2013.01); *H04L 1/06* (2013.01); *H04L 1/08* (2013.01); *H04L 65/4076* (2013.01); *H04L 65/607* (2013.01); *H04N 21/2381* (2013.01); *H04N 21/2383* (2013.01); *H04N 21/41407* (2013.01); *H04N 21/4381* (2013.01); *H04N 21/4382* (2013.01); *H04N 21/6131* (2013.01); *H04N 21/6437* (2013.01); *H03M 13/1102* (2013.01); *H03M 13/2732* (2013.01); *H03M 13/2936* (2013.01)

(58) Field of Classification Search
USPC .......................................... 714/752; 725/62
See application file for complete search history.

(56) References Cited

U.S. PATENT DOCUMENTS

| 6,691,274 | B1 | 2/2004 | Olds et al. |
| 6,744,822 | B1 | 6/2004 | Gaddam et al. |
| 6,760,077 | B2 | 7/2004 | Choi et al. |
| 6,914,560 | B2 | 7/2005 | Spilker, Jr. et al. |
| 7,162,272 | B1 * | 1/2007 | Hottinen .................. H04L 1/06 455/101 |
| 7,206,352 | B2 | 4/2007 | Birru et al. |
| 7,337,386 | B2 | 2/2008 | Chang et al. |
| 7,366,462 | B2 | 4/2008 | Murali et al. |
| 7,453,801 | B2 | 11/2008 | Taneja et al. |
| 8,213,551 | B2 * | 7/2012 | Kim ..................... H03M 13/256 375/341 |
| 8,332,896 | B2 * | 12/2012 | Shelby .................. H04L 65/607 714/751 |
| 2003/0207696 | A1 | 11/2003 | Willenegger et al. |
| 2004/0057535 | A1 | 3/2004 | Strolle et al. |
| 2004/0101046 | A1 | 5/2004 | Yang et al. |
| 2005/0138521 | A1 * | 6/2005 | Suzuki ............... H04B 7/18582 714/755 |
| 2006/0128425 | A1 * | 6/2006 | Rooyen .................. H04H 40/18 455/552.1 |
| 2006/0244865 | A1 | 11/2006 | Simon |
| 2006/0262651 | A1 | 11/2006 | Cooper et al. |
| 2007/0002734 | A1 | 1/2007 | Kim et al. |
| 2007/0064707 | A1 | 3/2007 | Pandel et al. |
| 2007/0081595 | A1 | 4/2007 | Choi et al. |
| 2007/0147440 | A1 | 6/2007 | Song et al. |
| 2007/0247395 | A1 | 10/2007 | Barraclough et al. |
| 2007/0277077 | A1 * | 11/2007 | Vesma ............. H03M 13/1515 714/755 |
| 2007/0286112 | A1 | 12/2007 | Prakash et al. |
| 2009/0016432 | A1 * | 1/2009 | Limberg ............... H04L 65/607 375/240.01 |
| 2009/0049361 | A1 * | 2/2009 | Koren ............... H03M 13/3738 714/755 |
| 2009/0067551 | A1 * | 3/2009 | Chen ..................... H04L 1/004 375/340 |
| 2009/0193487 | A1 | 7/2009 | Simon |
| 2009/0201805 | A1 * | 8/2009 | Begen .................. H04L 1/0009 370/225 |
| 2009/0238375 | A1 * | 9/2009 | Pilati ..................... H04L 1/004 381/79 |
| 2010/0115379 | A1 | 5/2010 | Gubbi et al. |
| 2011/0258510 | A1 * | 10/2011 | Watson ................ H03M 13/03 714/752 |
| 2013/0031588 | A1 * | 1/2013 | Shelby ................. H04L 65/607 725/62 |

OTHER PUBLICATIONS

"Annex D: RF/Transmission Systems Characteristics"; Digital Television Standard; XP-002187665; Sep. 16, 1995; 16 pages.
A. Touzni, H. Fu, M. Fimoff, and W. Bretl; "Enhanced 8-VSB Transmission for North-American HDTV Terrestrial Broadcast"; ICASSP 2003; Apr. 6, 2003; 4 pages.
International Search Report and Written Opinion, PCT/US2009/045763, mailed Nov. 4, 2009, 15 pages.
O. Simeone and U. Spagnolini; "Adaptive Pilot Pattern for OFDM Systems"; IEEE Communications Society; 2004; pp. 978-982.
Yuze Zhang, Michael P. Fitz, and Saul B. Gelfand; A Performance Analysis and Design of Equalization with Pilot Aided Channel Estimation; IEEE; 1997; pp. 720-724.
Lingyun Cai, Youyun Xu, Hanwen Luo, Wentao Song, and Baoyu Zheng; "Cell Search Frequency Synchronization for Beyond 3G"; IEEE 6th CAS Symp. on Emerging Technologies: Mobile and Wireless Comm., Shanghai, China, May 31-Jun. 2, 2004; pp. 45-48.
Fumiaki Tsuzuki and Tomoaki Ohtsuki; "SAGE Algorithm for Channel Estimation and Data Detection Using Superimposed Training in MIMO System"; IEEE; 2006; 3 pages.
Fumiaki Tsuzuki and Tomoaki Ohtsuki; "Channel Estimation with Selective Superimposed Pilot Sequences Under Fast Fading Environments"; IEEE; 2004; pp. 62-66.
"ATSC Digital Television Standard Part 2—RF/Transmission System Characteristics (A/53, Part 2:2007)"; Advanced Television Systems Committee; Jan. 3, 2007; 44 pages.
"Modulation and Coding Requirements for Digital TV (DTV) Applications Over Satellite—ATSC Standard"; Advanced Television Systems Committee; Jul. 17, 1999; 33 pages.
International Search Report and Written Opinion; Oct. 29, 2009; 17 pages.
Jill M. Boyce; "Packet loss resilient transmission of MPEG video over the Internet"; Signal Processing: Image Communication 15 (1999), pp. 7-24.

(56) References Cited

OTHER PUBLICATIONS

Mugen Peng and Wenbo Wang; "A Unified Architecture and Key Techniques for Interworking between WiMAX and Beyond 3G/4G Systems"; Oct. 2, 2007; pp. 67-90.
Digital Video Broadcasting (DVB); DVB-H Implementation Guidelines, ETSI TR 102 377, V1.2.1, Technical Report, XP-002406707, Nov. 2005, 104 pages.

* cited by examiner

FIG. 8

| SCCC Outer Code Mode for Region - | | | | PL - SCCC Block Mode/Frame Mode | | | |
|---|---|---|---|---|---|---|---|
| A | B | C | D | 00/00 | 00/01 | 01/00-AB | 00/01-CD |
| 00 | 00 | 00 | 00 | 9624 | 9624 | 7644 | 1980 |
| 00 | 00 | 00 | 01 | 9372 | 9624 | 7644 | 1728 |
| 00 | 00 | 01 | 00 | 8886 | 9624 | 7644 | 1242 |
| 00 | 00 | 01 | 01 | 8634 | 9624 | 7644 | 990 |
| 00 | 01 | 00 | 00 | 8403 | 9624 | 6423 | 1980 |
| 00 | 01 | 00 | 01 | 8151 | 9624 | 6423 | 1728 |
| 00 | 01 | 01 | 00 | 7665 | 9624 | 6423 | 1242 |
| 00 | 01 | 01 | 01 | 7413 | 9624 | 6423 | 990 |
| 01 | 00 | 00 | 00 | 7023 | 4812 | 5043 | 1980 |
| 01 | 00 | 00 | 01 | 6771 | 4812 | 5043 | 1728 |
| 01 | 00 | 01 | 00 | 6285 | 4812 | 5043 | 1242 |
| 01 | 00 | 01 | 01 | 6033 | 4812 | 5043 | 990 |
| 01 | 01 | 00 | 00 | 5802 | 4812 | 3822 | 1980 |
| 01 | 01 | 00 | 01 | 5550 | 4812 | 3822 | 1728 |
| 01 | 01 | 01 | 00 | 5064 | 4812 | 3822 | 1242 |
| 01 | 01 | 01 | 01 | 4812 | 4812 | 3822 | 990 |

FIG. 11

| SCCC Block mode = '00' | SOBL | SIBL | | | | |
|---|---|---|---|---|---|---|
| | R = | 3/4 | 2/3 | 1/2 | 1/3 | 1/4 |
| SCB1 (B1) | 528 | 396 | 352 | 264 | 176 | 132 |
| SCB2 (B2) | 1536 | 1152 | 1024 | 768 | 512 | 384 |
| SCB3 (B3) | 2376 | 1782 | 1584 | 1188 | 792 | 594 |
| SCB4 (B4) | 2388 | 1791 | 1592 | 1194 | 796 | 597 |
| SCB5 (B5) | 2772 | 2079 | 1848 | 1386 | 924 | 693 |
| SCB6 (B6) | 2472 | 1854 | 1648 | 1236 | 824 | 618 |
| SCB7 (B7) | 2772 | 2079 | 1848 | 1386 | 924 | 693 |
| SCB8 (B8) | 2508 | 1881 | 1672 | 1254 | 836 | 627 |
| SCB9 (B9) | 1416 | 1062 | 944 | 708 | 472 | 354 |
| SCB10 (B10) | 480 | 360 | 320 | 240 | 160 | 120 |

| SCCC Block mode = '01' | SOBL | SIBL | | | | |
|---|---|---|---|---|---|---|
| | R = | 3/4 | 2/3 | 1/2 | 1/3 | 1/4 |
| SCB1 (B1+B6) | 3000 | 2250 | 2000 | 1500 | 1000 | 750 |
| SCB2 (B2+B7) | 4308 | 3231 | 2872 | 2154 | 1436 | 1077 |
| SCB3 (B3+B8) | 4884 | 3663 | 3256 | 2442 | 1628 | 1221 |
| SCB4 (B4+B9) | 3804 | 2853 | 2536 | 1902 | 1268 | 951 |
| SCB5 (B5+B10) | 3252 | 2439 | 2168 | 1626 | 1084 | 813 |

FIG. 12

| Syntax | No. of Bits | Format |
|---|---|---|
| FICSegmentExtended() | | |
| { | | |
|   FIC_Type | 2 | '01' |
|   Reserved | 1 | '1' |
|   ESG_Version | 5 | uimsbf |
|   FIC_Segment_Number | 4 | uimsbf |
|   FIC_Last_Segment_Number | 4 | uimsbf |
| | | |
|   Associated Parade ID | 7 | uimsbf |
|   Station for service | 7 | uimsbf |
|   Augmentation Type | 4 | bslbf |
| | | |
|   Length $n_1$ | 4 | uimsbf |
|   Block Size of the service | $4*n_1$ | uimsbf |
|   Length $n_2$ | 4 | uimsbf |
|   Size of Augmentation Block | $4*n_2$ | uimsbf |
|   Length $n_3$ | 4 | bslbf |
|   Start of next Augmentation | $4*n_3$ | simsbf |
|   Block | 4 | uimsbf |
|   Length $n_4$ | $4*n_4$ | simsbf |
|   Start of Payload data | | |
| | | |
|   FIC_Stuffing | | |
| } | | |

*FIG. 17A*

| Augmentation Type | Description |
|---|---|
| 0000 | None |
| 0001 | ½ rate |
| 0010 | ⅓ rate |
| 0011 | ⅔ rate |
| 0111 | RS product code |
| 1000 - 1111 | Reserved |

*FIG. 17B*

| Syntax | No. of Bits | Format |
| --- | --- | --- |
| TPC_data { | | |
|    Sub-Frame_number | 3 | uimsbf |
|    Slot_number | 4 | uimsbf |
|    Parade_id | 7 | uimsbf |
|    starting_Group_number | 4 | uimsbf |
|    number_of_Groups | 3 | uimsbf |
|    Parade_repetition_cycle | 3 | uimsbf |
|    RS_Frame_mode | 2 | bslbf |
|    RS_code_mode_primary | 2 | bslbf |
|    RS_code_mode_secondary | 2 | bslbf |
|    SCCC_Block_mode | 2 | bslbf |
|    SCCC_outer_code_mode_A | 2 | bslbf |
|    SCCC_outer_code_mode_B | 2 | bslbf |
|    SCCC_outer_code_mode_C | 2 | bslbf |
|    SCCC_outer_code_mode_D | 2 | bslbf |
|    FIC_version | 5 | uimsbf |
|    Parade_continuity_counter | 4 | uimsbf |
|    Parade_Type | 2 | bslbf |
|    Block_Encoder_Mode | 2 | bslbf |
|    SCCC_outer_code_mode_extension_A | 2 | bslbf |
|    SCCC_outer_code_mode_extension_B | 2 | bslbf |
|    SCCC_outer_code_mode_extension_C | 2 | bslbf |
|    SCCC_outer_code_mode_extension_D | 2 | bslbf |
|    reserved | 27 | bslbf |
| } | | |

FIG. 18

| SCCC_Block_Mode_Extension | Description |
|---|---|
| 00 | SCCC output ½ rate Extended Mode2 (coding=C0,C2) |
| 01 | SCCC output ½ rate Extended Mode3 (coding=C1,C4) |
| 10 | Reserved |
| 11 | Reserved |

FIG. 24

| Region | ½ rate | ½ rate Extended Mode2 | ½ rate Extended Mode3 | ¼ rate | |
|---|---|---|---|---|---|
| | | | | SCCC Block mode | |
| | | | | '00' | '01' |
| A, B | (C0, C1) | (C0, C2) | (C1, C4) | (C0, C2), (C1, C4) | (C0, C2), (C1, C4) |
| C, D | | | | (C0, C1), (C3, C4) | |

FIG. 25

WIRELESS TRANSMISSION OF MULTIMEDIA STREAMS WHICH USES CONTROL INFORMATION TO ASSOCIATE ERROR CORRECTION CODING WITH AN AUDIOVISUAL STREAM

PRIORITY CLAIM

This application is a continuation of U.S. application Ser. No. 12/472,892 titled "Transmission of Multimedia Streams to Mobile Devices With Cross Stream Association" filed on May 27, 2009, which is a continuation-in-part of U.S. application Ser. No. 12/167,708 titled "Mobile Television Broadcast System" filed on Jul. 3, 2008, which claims benefit of priority to provisional application Ser. No. 60/948, 185 titled "Robust Mobile TV Broadcast System" filed Jul. 5, 2007, Ser. No. 60/958,585 titled "Robust Mobile TV Broadcast System" filed Jul. 5, 2007, and Ser. No. 60/999, 039 titled "Robust Mobile TV Broadcast System" filed Oct. 14, 2007, all of which are hereby incorporated by reference in their entirety as though fully and completely set forth herein.

U.S. application Ser. No. 12/472,892 also claims benefit of priority to provisional application Ser. No. 61/130,344 titled "Enhanced Mobile TV System" filed on May 31, 2008, which is hereby incorporated by reference in its entirety as though fully and completely set forth herein.

FIELD OF THE INVENTION

The present invention relates to a mobile television broadcast system, and more specifically in one embodiment relates to enhancement of the current ATSC Digital TV broadcast system for mobile services to mobile and handheld devices.

DESCRIPTION OF THE RELATED ART

The ATSC (Advanced Television Systems Committee) standard relates to a digital television format which will replace the analog NTSC television system. The ATSC standard is a high definition television standard that produces standard 4:3 or wide screen 16:9 images up to 1920×1080 pixels in size—more than six times the display resolution of the earlier NTSC standard. The ATSC standard makes provisions to transport multiple standard-definition "virtual channels" broadcast on a single 6 MHz TV channel. The ATSC standard also includes "theater quality" audio using the Dolby Digital AC-3 format to provide 5.1-channel surround sound. The ATSC standard also provides numerous auxiliary datacasting services.

The ATSC standard uses the MPEG-2 systems specification for encapsulation (transport) of data. More specifically, ATSC uses the 188-byte MPEG transport stream packets to carry data. MPEG-2 is also referred to as "transport stream", "MPEG-TS", or simply "TS". At the receiver side, before decoding of audio and video occurs, the receiver demodulates and applies error correction to the signal. Then, the transport stream may be demultiplexed into its constituent streams. A video codec, e.g. MPEG-2, H.264, VC-1, is used for encoding and decoding video, subject to certain constraints.

Previously, mobile reception of digital television stations transmitted using the ATSC standard has been difficult to impossible. For example, mobile reception of digital television stations is very difficult when moving at vehicular speeds. Therefore, there is a need for an improved system and method for transmission and/or reception of digital television signals for improved mobile reception.

SUMMARY OF THE INVENTION

Various embodiments are presented of a system and method for wirelessly communicating audiovisual information. One set of embodiments involves a system and method for wirelessly transmitting audiovisual information to a mobile device. Another set of embodiments involves a system and method for wirelessly receiving audiovisual information by a mobile device. The audiovisual information may be packetized according to the ATSC (Advanced Television Standards Committee) standard, e.g., using 8-VSB modulation The method for transmitting audiovisual information to a mobile device may include generating a first plurality of packets including first audiovisual information. The first plurality of packets may also include error correction coding information of a first type; or, there may be multiple types of error correction coding information in the first plurality of packets. A second plurality of packets including first error correction coding information for the first audiovisual information may also be generated. The first error correction coding information may be formed using a first error correction encoding method, while the error correction coding information in the first plurality of packets may be formed using a second error correction encoding method. The first and second error correction encoding methods may be the same or may be different error correction encoding methods.

The first error correction coding information may include a first pattern of error correction coding information and a second pattern of error correction coding information. The first and second patterns of error correction coding information may be complementary to each other; alternatively, they may overlap or be identical. The first and second patterns of error correction coding information may be separated in time and/or frequency; in other words, they may be configured for transmission at different times and/or on different frequencies.

Control information, including commands for associating the first error correction coding information with at least a portion of the first audiovisual information, may also be generated. Thus, although the first error correction coding information and the first audiovisual information may be in different streams (e.g., different sets of packets), and may in some embodiments be transmitted separately in time and/or on different frequencies, the control information may be usable by a mobile device (e.g., may inform the mobile device) to associate the first error correction coding information and the first audiovisual information with each other, thereby enabling the mobile device to use the first error correction coding information in processing the first audiovisual information. Once the control information is generated, the control information may be included in the second plurality of packets with the first error correction coding information, or may be included in a third plurality of packets.

The plurality of packets, including the first, second, and (possibly) third pluralities of packets, may be wirelessly transmitted, e.g., to a mobile device. The plurality of packets may be transmitted by a transmitter, e.g., including an antenna.

In some embodiments, there may be additional packets generated. For example, in one embodiment, a fourth plurality of packets, including second audiovisual information, may be generated. The second audiovisual information may be completely complementary to the first audiovisual information, or partially overlapping (i.e., at least a portion of the first and second audiovisual information may be the same audiovisual information), or the first and second audiovisual may be identical or redundant. The fourth plurality of packets may also include error correction coding information, similar to the first plurality of packets. In some embodiments, even if the first and second audiovisual information are partially or entirely redundant, the error correction coding information for each may be partially or entirely complementary. Alternatively, the first and fourth pluralities of packets may be identical, including error correction coding information; for example, one set of packets may be backup information, sent at a different time or on a different frequency than the other set of packets. It should further be noted that it is possible that the first and fourth pluralities of packets (the first and second audiovisual streams) may be configured for transmission at separate times and/or frequencies, regardless of whether they are identical or not. In some embodiments, neither (or, only one of) the first and fourth pluralities of packets includes error correction coding information; for example, any error correction coding information for the first and second audiovisual information may be sent separately in another stream (e.g., in another set of packets). The commands in the control information may also associate the first and second audiovisual information. This may also include associating any error correction coding information for the first and second audiovisual information, whether that error correction coding information is located in the same plurality of packets or in a different plurality of packets as the audiovisual information for which it is intended.

A fifth plurality of packets may also be generated. The fifth plurality of packets may include second error correction coding information, e.g., for the second audiovisual information. The second error correction coding information may be a (partially or entirely) complementary pattern of error correction coding information to the first error correction coding information. For example, the first and second audiovisual information may be associated, and if the respective error correction coding information for the first and second audiovisual information is complementary, the complementary patterns of the first and second error correction coding information would together form a stronger form of error protection. Thus, the commands in the control information may also associate the second error correction coding information with the second audiovisual information, and in some embodiments, may associate the first audiovisual information and the first error correction coding information with the second audiovisual information and the second error correction coding information. Alternatively, the commands in the control information may simply associate the first audiovisual information with the first error correction information, the second audiovisual information with the second error correction information, and the first audiovisual information with the second audiovisual information, and a mobile device receiving said control information may implicitly associate the second error correction coding information with the first audiovisual information and the first error correction coding information with the second audiovisual information due to the explicit associations in the control information.

The method for wirelessly transmitting audiovisual information to a mobile device may be performed partially or entirely by a system, which in various embodiments may include some or all of memory for storing the audiovisual information, transmit logic coupled to the memory and configured to generate the packets and the control information, and a transmitter for transmitting the pluralities of packets.

The method for wirelessly receiving audiovisual information by a mobile device may include wirelessly receiving a plurality of packets. The packets may include first and second pluralities of packets (and in some embodiments, third, fourth and fifth pluralities of packets), which may be correspond to the first and second pluralities of packets (and in some embodiments, the third, fourth and fifth pluralities of packets) as described above with respect to the method for wirelessly transmitting audiovisual information to a mobile device, according to any of the various embodiments described above.

The first error correction coding information (in the second plurality of packets) may be associated with at least a portion of the first audiovisual information (in the first plurality of packets) based on the control information. If there are fourth and fifth pluralities of packets, the second error correction coding information may also be associated with the second audiovisual information based on the control information. Likewise, one or more of: the first audiovisual information and the second audiovisual information; the first audiovisual information and the second error correction coding information; or the second audiovisual information and the first error correction coding information, may be associated, either based explicitly on the commands in the control information or implicitly based on other cross stream associations.

The audiovisual information may be processed for presentation on the mobile device. Processing the audiovisual information may include processing the first audiovisual information and any associated error correction coding information (such as, according to various embodiments, might be contained in the first, second, and/or fifth pluralities of packets), and in some embodiments, processing the second audiovisual information and any associated error correction coding information (such as, according to various embodiments, might be contained in the second, fourth, and/or fifth pluralities of packets). In some embodiments, the first and second audiovisual streams (e.g., the first and fourth pluralities of packets) may be processed together, and with all of the associated error correction coding information for both streams.

Processing the audiovisual information with the associated error correction coding information may enable presentation of the audiovisual information even under adverse receiving conditions, e.g., if there is background noise in the transmission channel, or while the mobile device is moving rapidly and/or unpredictably. In addition, if the audiovisual information and/or the associated error correction coding information are received separately, at different times and/or frequencies, this may reduce the susceptibility of the mobile device to specific reception issues such as burst noise and deep channel fading, because even if some of the error correction coding information is lost, or some partially redundant audiovisual information is lost, there may be enough audiovisual and/or error correction coding information received at other times and/or frequencies such that service at the mobile device may be uninterrupted.

Once the audiovisual information is processed for presentation, the processed audiovisual information may be presented on the mobile device. This may include presenting (e.g., displaying) video information on a display and/or presenting (e.g., playing) audio information on one or more speakers.

The method for wirelessly receiving audiovisual information by a mobile device may be performed by a mobile device. The mobile device may include an antenna for wirelessly receiving the packets, receiver logic coupled to the antenna for associating the audiovisual and error correction coding information, processing the audiovisual and error correction coding information, and presenting the processed audiovisual information, and a display and one or more speakers on which the audiovisual information may actually be presented.

BRIEF DESCRIPTION OF THE DRAWINGS

A better understanding of the present invention can be obtained when the following detailed description of the preferred embodiment is considered in conjunction with the following drawings, in which:

FIG. 8 is an illustration of several additional puncturing patterns resulting in coding rates of R=1/3, R=2/3, and R=4/5 according to one embodiment;

FIG. 11 is a table listing payload length based on SCCC outer code modes for each SCCC block mode/frame mode according to one embodiment;

FIG. 12 is a table listing SCCC output/input block lengths for various coding rates according to one embodiment;

FIGS. 17A and 17B show syntax for a FIC channel according to one embodiment;

FIG. 18 shows syntax for a TPC channel according to one embodiment;

FIG. 24 is a table defining the SCCC_Block_Mode_Extension term in the TPC syntax according to one embodiment;

FIG. 25 is a table showing how a convolutional encoder may define its output in a way consistent with the syntax in the TPC channel defined in FIG. 24 according to one embodiment;

Figure 1:
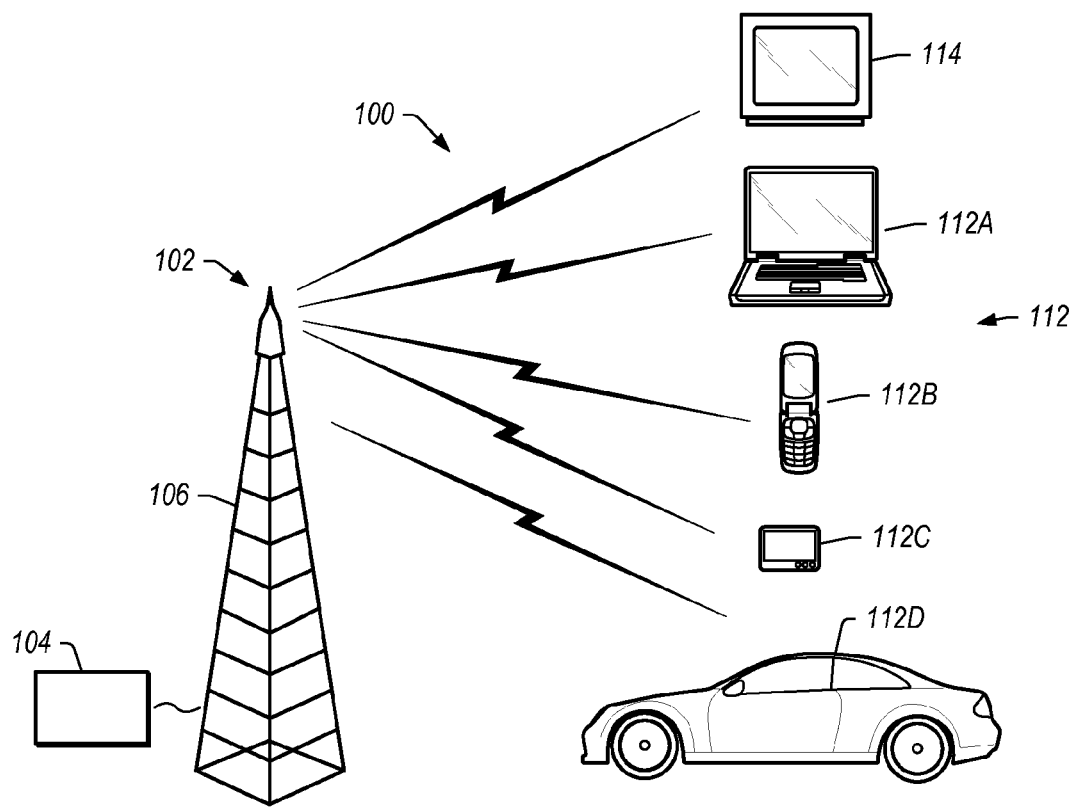
FIG. 1 illustrates a digital television broadcast system according to one embodiment.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

FIG. 1—Digital Television Broadcast System

FIG. 1 illustrates an exemplary broadcast system 100 according to one embodiment of the invention. In one embodiment, the broadcast system may be a digital television broadcast system. The broadcast system 100 described herein, including the various methods described herein, may be used for broadcasting any of various types of data, including audiovisual information as well as other data.

As used herein, the term "audiovisual information" includes any of various types of information or data that comprises video data and/or audio data. The term "video data" includes motion video (such as television, movies, streaming video, etc., as well as image data, such as JPEGs. The term "audiovisual information" further includes any of various types of information or program instructions that, when executed, cause a device to present video data (on a display) and/or audio data (on speakers). For example, the term "audiovisual information" includes any of various types of gaming content (including program instructions and/or data) that can be used and/or executed to present gaming content (e.g., images, video, and/or audio) on a presentation device.

The broadcast system 100 and the various methods described herein are described in the present application in the context of transmitting audiovisual information for presentation by a receiving device, in particular digital television. However, it is noted that the broadcast system 100 and the various methods described herein may be used for transmission/reception of any of various types of data (e.g., audiovisual information, email, files, text documents, seismic data, measurement data, weather data, etc.), with audiovisual information being merely one representative example.

In one set of embodiments, the broadcast system may operate according to the ATSC (Advanced Television Standards Committee) standard, e.g., using 8-VSB modulation. Alternatively, the broadcast system may operate according to a modified version of the ATSC standard, or according to another standard. For example, the Mobile/Handheld (M/H) modification of the ATSC standard is used for transmission of audiovisual information for moving receivers. The current M/H system transports M/H services in bursts alongside the main service stream encapsulated in NULL packets consistent with the methods prescribed for E-VSB service multiplexing. The system uses serial concatenated convolutional coding (SCCC) for additional robustness. To aid M/H reception, the existing M/H system supplements the base 8VSB transport with the addition of extra training multiplexed with the mobile packet data in such a way that the training data appears in contiguous bytes (2 full segments per training) at transmission. Thus, when it is available, a receiver can utilize this additional training information to update its equalizer in order to track fast moving channel conditions. Specific examples of the embodiments disclosed herein may be based on, or include portions of the M/H modification to the ATSC standard, and may also include further variations and modifications to M/H and the ATSC standard. However, the embodiments related to transmission of audiovisual information disclosed herein are not necessarily limited to use with the ATSC or M/H systems, and may be equally applicable for transmission of audiovisual information in accordance with other standards and/or modulations schemes, such as DVB-T/H, ISDB-T, DMB-T/H, etc.

As shown, the system 100 comprises a transmission system (or transmit system) 102, one or more mobile devices 112 (e.g., mobile devices 112A-112D), and at least one stationary device 114. As noted above FIG. 1 is exemplary only, e.g., an exemplary system may comprise one or more transmission systems 102, a plurality of mobile devices 112, and a plurality of stationary devices 114.

The transmission system 102 is configured to transmit audiovisual information to the one or more mobile devices 112 in a wireless manner. More particularly, the transmission system 102 may be configured to transmit digital television signals/channels to the mobile devices 112. The mobile devices 112 may receive and present the audiovisual information, e.g., receive and present the digital television signals/channels. The transmission system 102 may also be configured to transmit audiovisual information to the stationary device 114 (e.g., stationary television) in a wireless manner. The transmission system 102 is also configured to transmit audiovisual information to the one or more stationary devices 114, e.g., televisions.

For the sake of convenience, embodiments of the invention are described herein with respect to reception by mobile devices 112. However, the various embodiments of the invention described herein may also of course be used for reception by stationary devices. For example, one embodiment of the invention provides for reception of additional error correction information by stationary devices 114 for the purpose of enhancing the robustness of the terrestrial broadcast. Thus any of the various methods described herein may be utilized with either mobile devices 112 or stationary devices 114, or both, as desired.

The transmission system 102 comprises a transmitter 106 as well as transmit logic 104 coupled to the transmitter 106. The transmit logic 104 may comprise any of various types of logic, such as one or more computer systems (with accompanying software), digital logic, analog logic, programmable gate arrays, etc., or combinations thereof. The transmit logic 104 is adapted for receiving and/or storing audiovisual information (e.g., television data) and for generating packets containing the audiovisual information. The transmit logic 104 may generate packets according to any of various standards, such as the ATSC (Advanced Television Standards Committee) standard, e.g., using 8-VSB modulation. The transmission system 102 may use other modulation schemes, such as DVB-T/H, ISDB-T, DMB-T/H, etc. The transmit logic 104 is also adapted for generating error correction coding information. For example, the transmit logic 104 may be configured to encode data with any of various types of error correction techniques, including (but not limited to): convolutional coding (such as trellis encoding), block coding (such as Reed-Solomon encoding), or other error correction techniques. The transmit logic 104 may be configured to encode data with more than one error correction technique. The transmit logic 104 is also configured to generate packets containing control information as described herein. In one embodiment, one or more of the digital television channels are intended for stationary receivers, such as televisions. One or more of the digital television channels may also be intended for mobile and/or handheld (M/H) (referred to collectively herein as "mobile") devices 112. In one embodiment, one or more of the digital television channels may be intended for either stationary receivers or mobile devices.

As described herein, for digital television channels intended for mobile devices 112 (and possibly for all channels, e.g., channels intended for stationary devices 114 and/or mobile devices 112), the transmit logic 104 may be configured to generate packets containing error correction coding information. For example, the transmit logic 104 may generate error correction coding information for audiovisual information, and may transmit the error correction coding information in a separate packet (or packets) than the audiovisual information, with another packet (or packets) containing control information for associating the error correction coding information with the audiovisual information. Thus, a receiver (such as a stationary receiver) which does not require or is not configured to use the error correction coding information may ignore the error correction coding information packet and simply receive the audiovisual information as a normal audiovisual stream, while a receiver (such as a mobile device) which does require additional error correction coding information and is configured to use the error correction coding information may associate the error correction coding information with the audiovisual information (e.g., based on the control information) and thereby achieve a more robust system. Furthermore, the control information can be used by the transmit logic 104 to generate and transmit new types of error correction coding that is usable by the receiver.

The mobile devices 112 may be any of various types of devices, such as portable computer systems (laptops) 112A, wireless telephones 112B (e.g., Blackberrys, iphones, etc.), personal digital assistants 112C, television equipment 112D configured in vehicles, and other types of portable devices capable of displaying received audiovisual information.

The mobile devices 112 are configured to wirelessly receive (e.g., with an antenna) the packets transmitted by the transmitter 106, including the packets containing audiovisual information, the packets containing error correction coding information, and the packets containing control information. A respective mobile device 112 may also include receiver logic for processing the received audiovisual information, as well as a display for presenting video information and one or more speakers for presenting audio information. Thus each of the mobile devices 112 may include television-like capabilities for presenting received television channels as described herein.

The stationary devices 114 may be any of various types of devices that are intended to be placed at a fixed location (referred to as stationary or "non-mobile"), such as conventional televisions, e.g., liquid crystal displays (LCD displays), plasma displays, etc.

Figure 2:
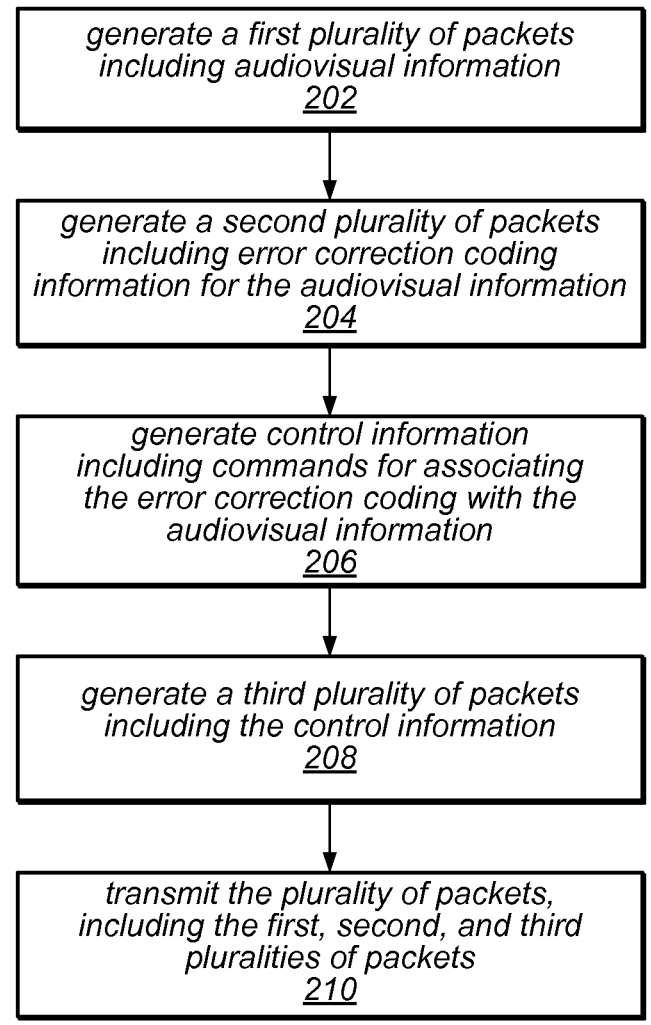
FIG. 2 is a flowchart diagram illustrating a method for wirelessly transmitting audiovisual information to a mobile device according to one embodiment.

FIG. 2—Transmit Flowchart

FIG. 2 is a flowchart depicting a method for transmitting audiovisual information. The method may be performed by a transmission system such as described above and shown in FIG. 1, e.g., a system including transmit logic and a transmitter. The audiovisual information may be for reception by mobile devices; alternatively, the audiovisual information may be for reception by stationary devices, or, both mobile and stationary devices. It should be noted that, according to various embodiments, one or more of the steps may be omitted, repeated, or performed in a different order than shown in FIG. 2 and described below.

In 202, a first plurality of packets including audiovisual information may be generated. The packets containing audiovisual information may include one or more content streams intended for mobile and/or stationary devices. In one embodiment, the packets may be generated according to the ATSC (Advanced Television Standards Committee) DTV (digital television) standard containing one or more digital television channels intended for stationary receivers (e.g., televisions); alternatively, or in addition, the packets may contain one or more digital television channels intended for mobile/handheld (M/H) receivers.

Generation of the packets containing audiovisual information may comprise various steps, such as encoding the audio and video data (e.g., using MPEG-2 encoding), applying forward error correction, generating appropriate packet headers and control information, etc. The forward error correction may take any number of forms, including Reed-Solomon (RS) encoding, Trellis encoding, cyclic redundancy codes (CRCs), or any other form of error correction coding, including a combination of multiple methods.

Figure 6:
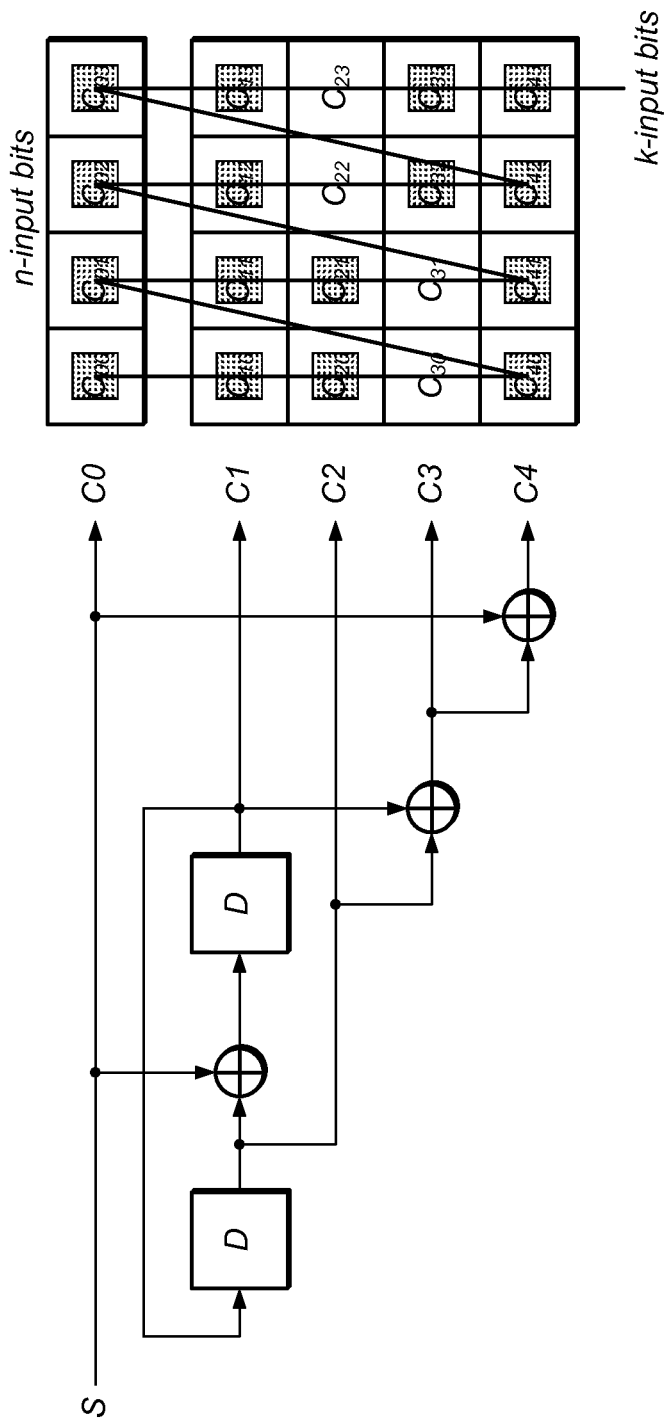
FIG. 6 is an illustration of a four state systematic convolutional encoder according to one embodiment.

In 204, a second plurality of packets including error correction coding information for the audiovisual information may be generated. The error correction coding information in the second plurality of packets may be any type of error correction coding, as desired; thus, it may be the same as or different than the error correction coding information in the first plurality of packets. The error correction information in the second plurality of packets may be supplemental to any error correction information in the first plurality of packets. In one embodiment, both the first and second pluralities of packets may include coding information from a four state convolutional encoder, such as shown in FIG. 6 and described with respect thereto.

Figure 13:
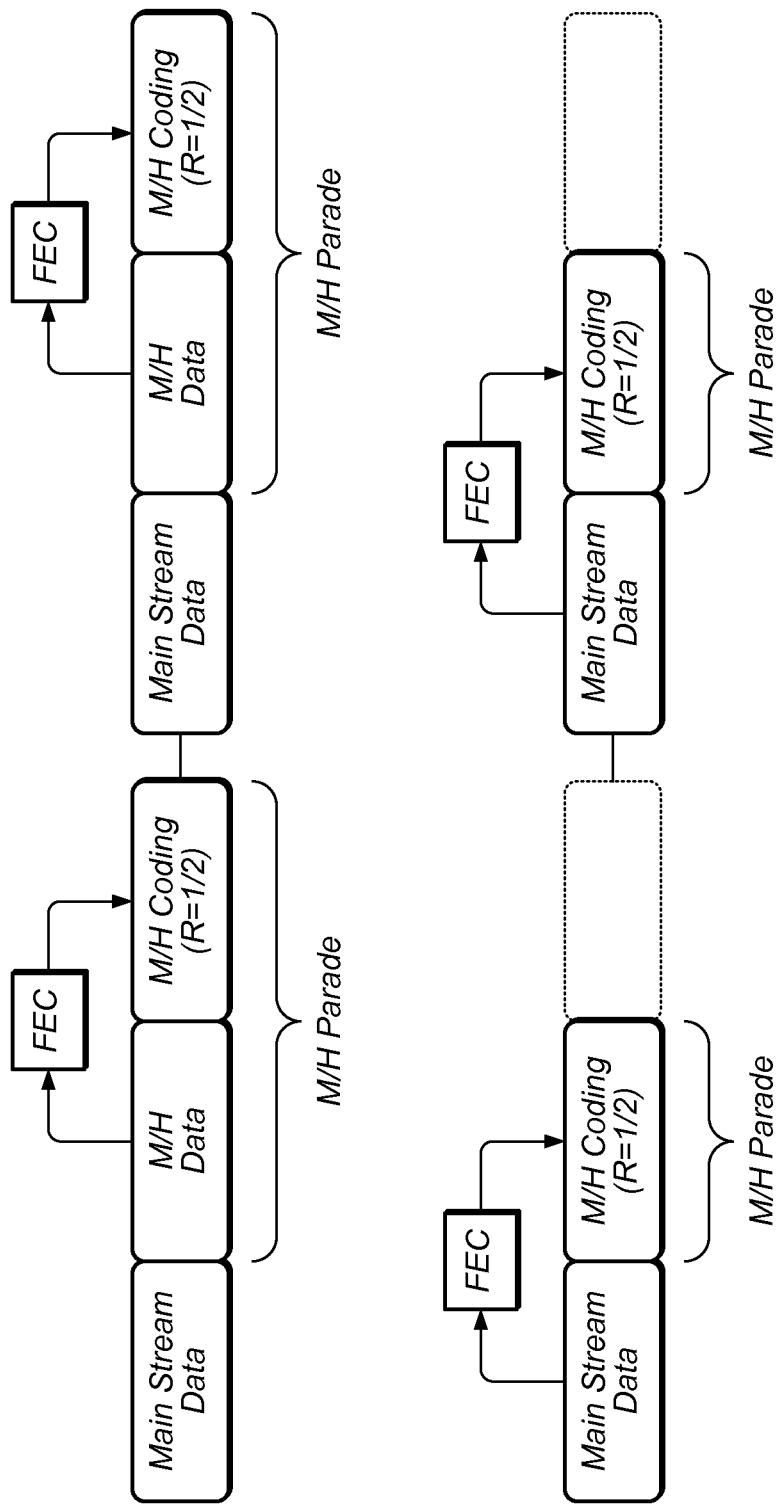
FIG. 13 is an illustration of main stream augmentation as compared to a prior art solution according to one embodiment.

In a specific embodiment, the packets including the audiovisual information may include a systematic (i.e., including the input (audiovisual) data) coding scheme, while the packets including the additional error correction coding information may include a complementary non-systematic (i.e., including only coded (error correction) data) coding scheme. This is referred to herein as 'main stream augmentation' and is described in more detail according to an exemplary embodiment with respect to FIGS. 13 and 14.

In another embodiment, the packets including the additional error correction information may include more than one complementary non-systematic coding scheme. In other words, there may be a systematic coding scheme in the audiovisual stream and two or more error correction coding patterns, complementary to each other and to the systematic coding scheme in the audiovisual stream, in a separate error correction stream. This is referred to herein as 'nested stream encoding' and is described in more detail according to an exemplary embodiment with respect to FIG. 22.

Figure 19:
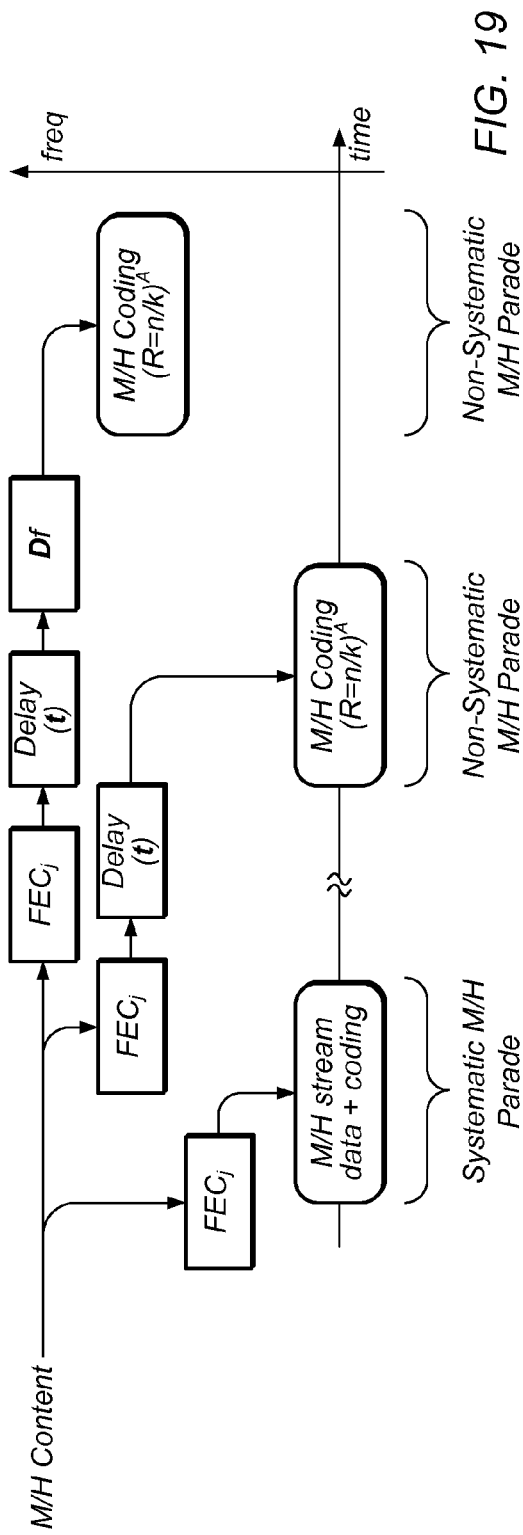
FIG. 19 illustrates transmission diversity methods according to one embodiment.

In some embodiments, two or more of these audiovisual and/or error correction streams may be separated in time and/or frequency. In other words, one stream may be sent at one time on a certain frequency, while another stream may be sent at a specified time delay and/or on a different frequency. This may be used in combination with any of main stream augmentation, nested stream encoding, or stagger casting (which will be defined later), as desired. This is referred to herein as 'transmission diversity' and is explained more fully with respect to FIGS. 19-21.

In 206, control information including commands for associating the error correction coding with the audiovisual information may be generated. The control information may indicate which error correction coding information is to be associated with which audiovisual information, and may indicate where in the pluralities of packets the error correction coding information and the audiovisual information to be associated are to be found. In other words, the control information may be usable by a mobile device receiving the first plurality of packets and the second plurality of packets to determine which error correction information in the second plurality of packets to use to process a particular block of audiovisual information from the first plurality of packets. The control information may be in any number of formats, or may be divided into multiple formats. For example, in the ATSC M/H system, there may be a Fast Information Channel (FIC) and a Transmission Protocol Channel (TPC). Each of these may include part of the control information. In one embodiment, the presence of an augmented main stream (e.g., the presence of additional error correction information in the second plurality of packets) may be signaled in the TPC, while the location, length, and form (and/or other information) of the additional error correction may be signaled in the FIC. Specific embodiments of TPC and FIC signaling and syntax are shown in FIGS. 16-18 and described with respect thereto, however, it should be noted that these are exemplary only, and other kinds of control information (or other syntax for the TPC and/or the FIC) for associating the error correction coding information in the second plurality of packets with the audiovisual information in the first plurality of packets are also possible. If any of the information to be associated is separated in time and/or frequency (i.e., if transmission of the information is time and/or frequency diverse), the control information may also indicate this.

In general, the use of control information to associate separate streams of information (audiovisual, error correction, or otherwise) for use together is referred to herein as 'cross stream association'. Cross stream association is an underlying concept to main stream augmentation, nested stream encoding, and stagger casting (as will be defined later), and allows for planned and systematic use of transmission diversity, in particular in combination with these cases, in order to achieve a significant improvement in packetized data transmission, and in particular packetized transmission of audiovisual information for mobile devices.

In 208, a third plurality of packets including the control information may be generated. The control information may be packetized in a similar way as the first plurality of packets and the second plurality of packets. In an alternative embodiment, some or all of the control information may be included in either the first plurality of packets, or the second plurality of packets, or both, rather than separately in a third plurality of packets. However, in some embodiments, sending the control information separately may be beneficial, e.g., in the case where both stationary devices and mobile devices should be able to use the audiovisual stream, but stationary devices might not be able to use the control information; in this case, sending the control information with the audiovisual information could potentially render the audiovisual stream unusable for the stationary devices.

Figure 3:
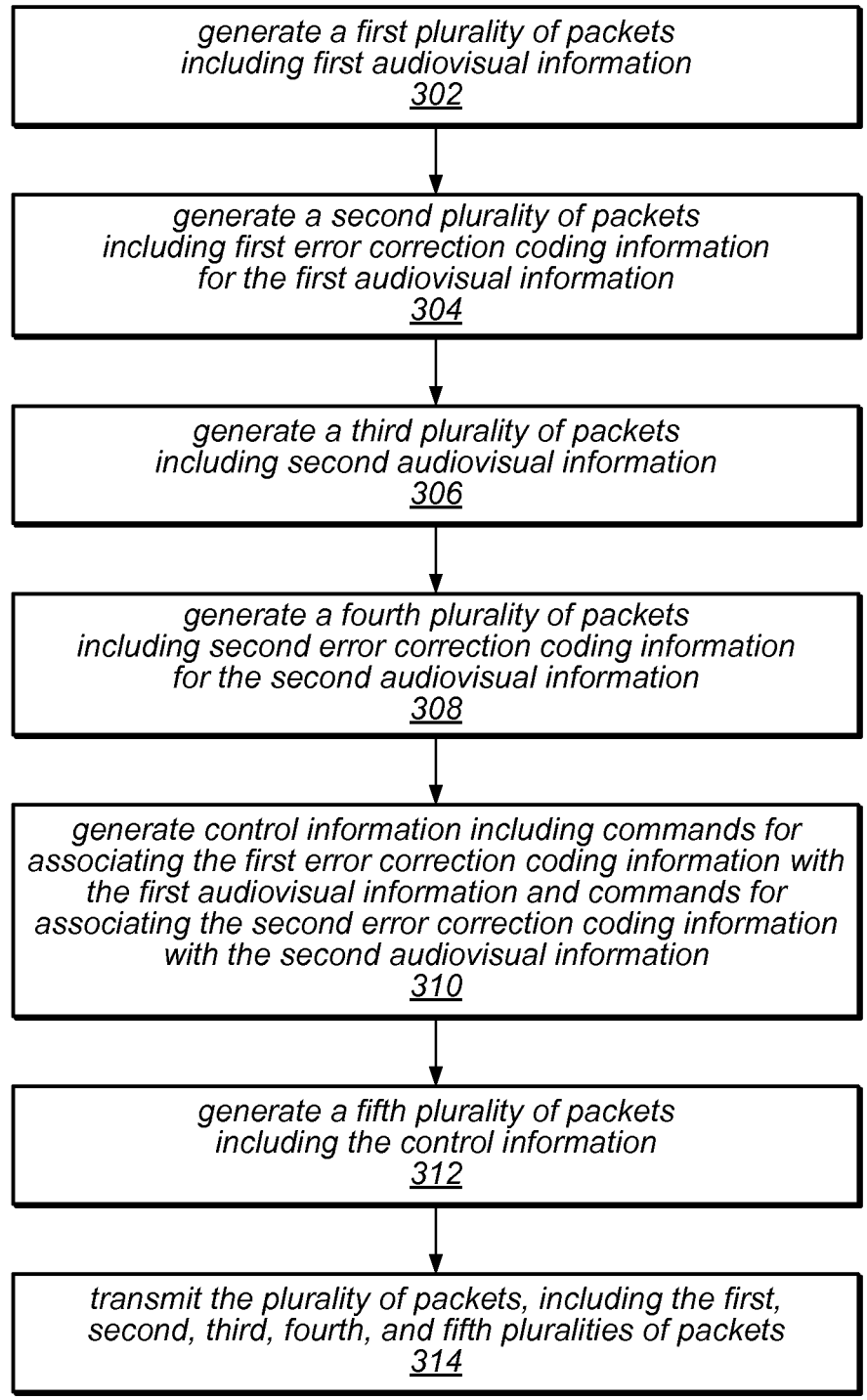
FIG. 3 is a flowchart diagram illustrating a method for wirelessly transmitting audiovisual information to a mobile device according to one embodiment.
Figure 4:
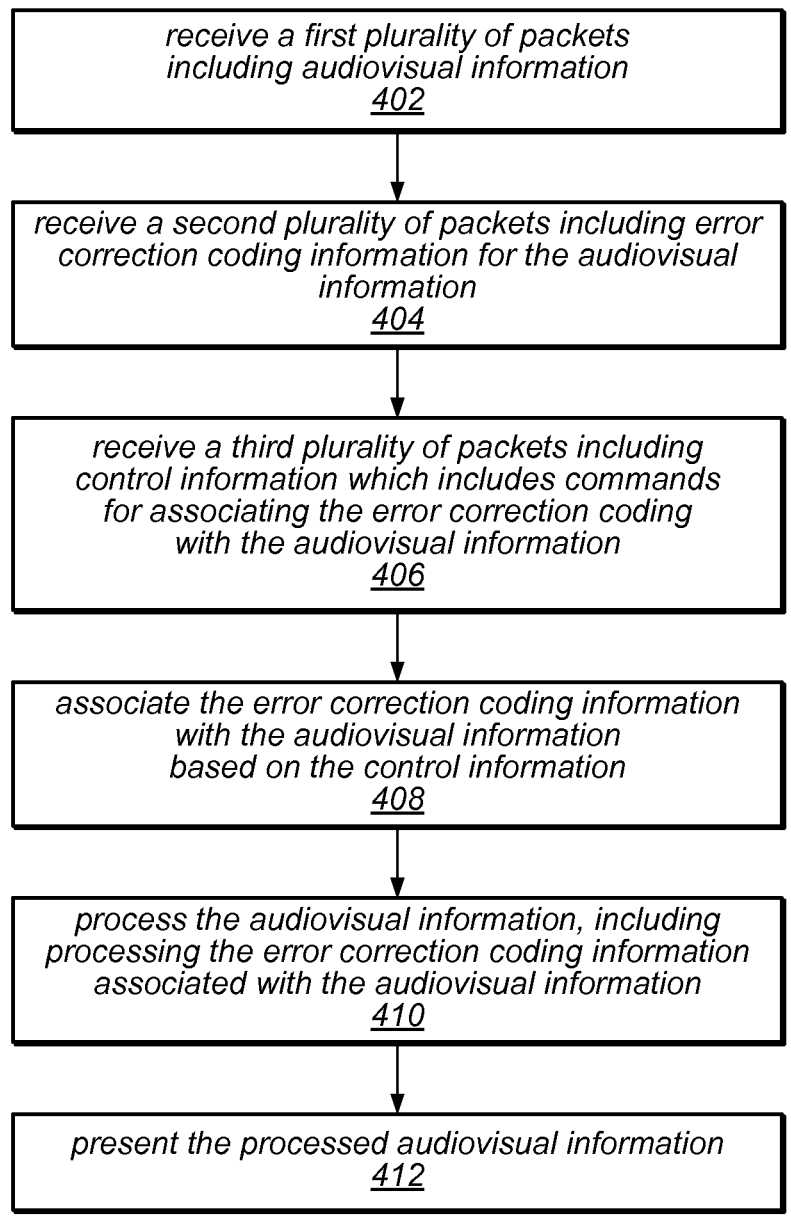
FIG. 4 is a flowchart diagram illustrating a method for a mobile device to wirelessly receive and present audiovisual information.
Figure 5:
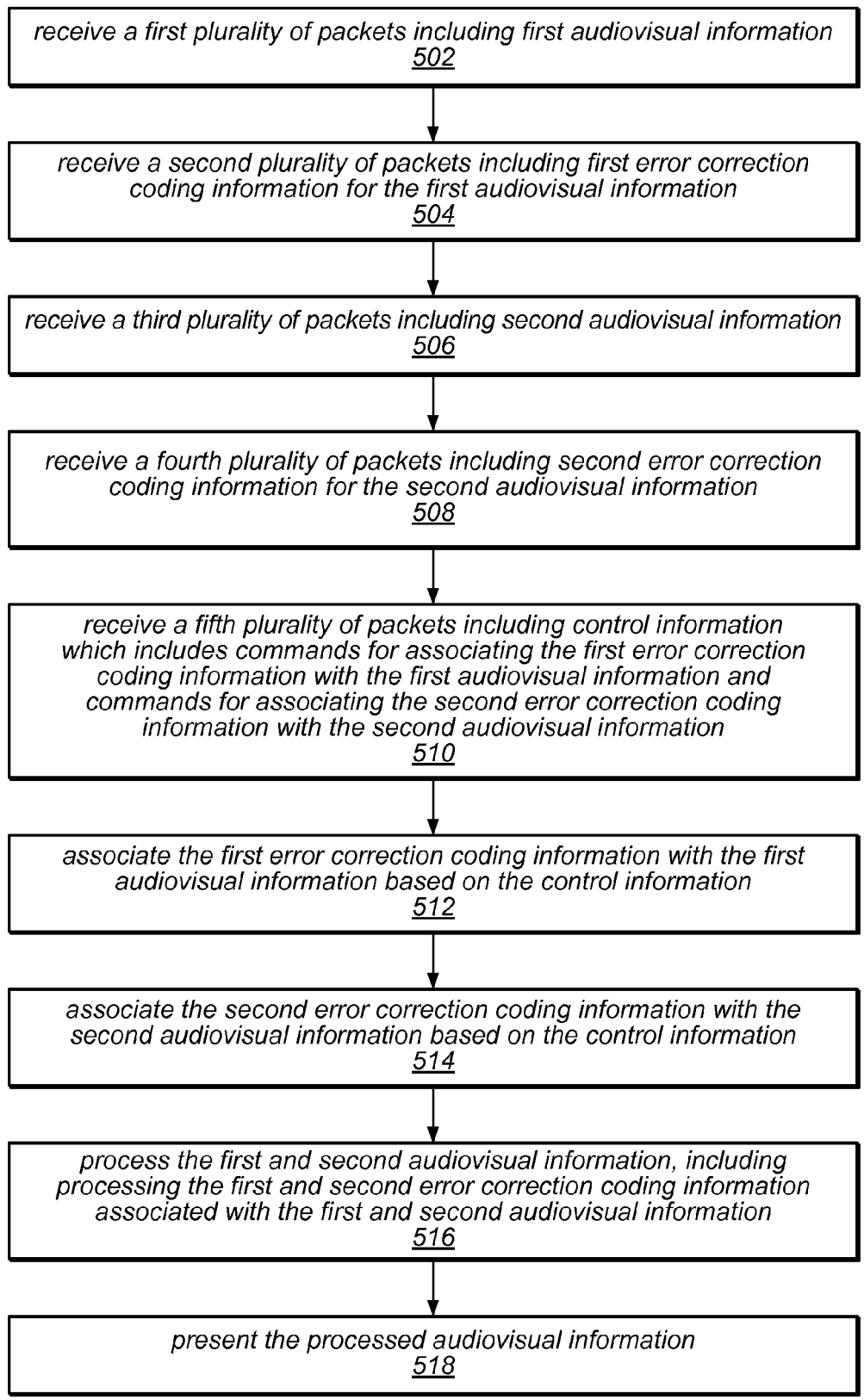
FIG. 5 is a flowchart diagram illustrating a method for a mobile device to wirelessly receive and present audiovisual information.

FIGS. 2-5 describe an embodiment where the control data is placed in a third (or fifth) plurality of packets, i.e., in packets separate from those containing the audiovisual information and the error correction information. However, as noted above the control data may be placed in either the first plurality or second plurality of packets, or both (in the case of FIGS. 2 and 4). In the case of FIGS. 3 and 5, the control data may be placed in any one or more of the first-fourth plurality of packets, as desired.

In 210, the plurality of packets, including the first, second, and (possibly) third pluralities of packets, may be transmitted. Transmission of these pluralities of packets may comprise multiplexing the first, second, and third pluralities of packets (multiplexing the first, second and third streams). Multiplexing of these different packets or streams may be performed based on a ratio of the relative bandwidth allocations of the respective pluralities of packets (or streams). In one embodiment corresponding to continuous mode, multiplexing these different packet streams comprises ordering the packets to distribute them evenly according to their relative bandwidth. In another embodiment corresponding the burst mode, the different packet streams are aggregated in separate bursts preceded by control information (aggregated in its own burst) to indicate the start position of the remaining bursts. The multiplexing may operate to reduce transmission overhead. In one embodiment, the transmission method transmits size information regarding the bandwidth allocations of the various packet streams, wherein the size information is useable at the receiver to demultiplex the received packet streams.

FIG. 3—Extended Transmit Flowchart

FIG. 3 is a flowchart depicting a method for transmitting audiovisual information in multiple streams. The method may be performed by a transmission system such as described above and shown in FIG. 1, e.g., a system including transmit logic and a transmitter. The audiovisual information may be for reception by mobile devices; alternatively, the audiovisual information may be for reception by stationary devices, or both mobile and stationary devices. It should be noted that, according to various embodiments, one or more of the steps may be omitted, repeated, or performed in a different order than shown in FIG. 2 and described below.

In 302, a first plurality of packets including first audiovisual information may be generated. The packets containing the first audiovisual information may include one or more content streams intended for mobile and/or stationary devices. In one embodiment, the packets may be generated according to the ATSC (Advanced Television Standards Committee) DTV (digital television) standard containing one or more digital television channels intended for stationary receivers (e.g., televisions); alternatively, or in addition, the packets may contain one or more digital television channels intended for mobile/handheld (M/H) receivers.

Generation of the packets containing the first audiovisual information may comprise various steps, such as encoding the audio and video data (e.g., using MPEG-2 encoding), applying forward error correction, generating appropriate packet headers and control information, etc. The forward error correction may take any number of forms, including Reed-Solomon (RS) encoding, Trellis encoding, cyclic redundancy codes (CRCs), or any other form of error correction coding, including a combination of multiple methods.

In 304, a second plurality of packets including first error correction coding information for the first audiovisual information may be generated. The first error correction coding information in the second plurality of packets may be any type of error correction coding, as desired; thus, it may be the same as or different than the error correction coding information in the first plurality of packets. The error correction coding information in the second plurality of packets may be supplemental to any error correction information in the first plurality of packets. In one embodiment, both the first and second pluralities of packets may include coding information from a four state convolutional encoder, such as shown in FIG. 6 and described with respect thereto.

In a specific embodiment, the packets including the first audiovisual information may include a systematic coding scheme, while the packets including the first error correction coding information may include a complementary non-systematic coding scheme. In other words, the first error correction coding information may be an augmentation to the main stream (e.g., the first audiovisual information).

In another embodiment, the packets including the first error correction information may include more than one complementary non-systematic coding scheme. In other words, there may be a systematic coding scheme in the first audiovisual stream and two or more error correction coding patterns, complementary to each other and to the systematic coding scheme in the audiovisual stream, in a separate error correction stream (or streams). In other words, the first error correction coding information may be encoded in multiple nested streams.

In some embodiments, two or more of these audiovisual and/or error correction streams may be separated in time and/or frequency. In other words, one stream may be sent at one time on a certain frequency, while another stream may be sent at a specified time delay and/or on a different frequency. This may be used in combination with any of main stream augmentation, nested stream encoding, or stagger casting (which will be defined below), as desired. In other words, the multiple streams of audiovisual and/or error correction coding information may be configured for transmission diversity.

In 306, a third plurality of packets including second audiovisual information may be generated. The second audiovisual information may be complementary to, partially complementary to and partially overlapping with, or completely overlapping with the first audiovisual information. In general, the first and second audiovisual information may benefit from being associated with each other; for example, the first and second audiovisual information may build on each other to produce a more robust signal.

In 308, a fourth plurality of packets including second error correction coding information for the second audiovisual information may be generated. The second error correction coding information may be any type of error correction coding, as desired; thus, it may be the same as or different than the error correction coding information in the third plurality of packets. The error correction information in the fourth plurality of packets may be supplemental to any error correction information in the third plurality of packets. In one embodiment, both the third and fourth pluralities of packets may include coding information from a four state convolutional encoder, such as shown in FIG. 6 and described with respect thereto.

In a specific embodiment, the third plurality of packets may include a systematic coding scheme, while the fourth plurality of packets may include a complementary non-systematic coding scheme. Thus, in some embodiments, the first audiovisual information may be the input data in a systematic coding scheme, while the second audiovisual information may be complementary or overlapping input data in a complementary or overlapping coding scheme. The coded data (error correction information) for the complementary or overlapping coding schemes may be complementary.

The audiovisual streams (first and third pluralities of packets) may include this complementary error correction information; alternatively, or in addition, the complementary error correction coding information may be the error correction information in the second and fourth pluralities of packets. In some embodiments, the error correction coding information in the second and/or fourth packets may also be systematic coding schemes. Thus, in some embodiments, there may be a number of streams of overlapping or complementary audiovisual streams with complementary error correction coding information. In another possible embodiment, the error correction information in the second and fourth pluralities of packets may be non-systematic, but still complementary. In this case, there would be nested stream encoding in addition to the multiple complementary/overlapping audiovisual streams.

In other words, the audiovisual data may be either overlapping or complementary, while the error correction information may be complementary. In this way, it may be possible for a device to receive either the first packets with the first audiovisual information, or the third packets with the second audiovisual information, and use the audiovisual information even if the complementary/overlapping audiovisual information isn't received. On the other hand, if all of the complementary/overlapping audiovisual information is received, the complementary coding data may provide additional robustness, allowing for a lower receive threshold. The case where multiple streams with overlapping audiovisual data with complementary error correction information are transmitted is referred to herein as 'stagger casting' and is described in further detail as it could be implemented in one embodiment with respect to FIGS. 23-25. Transmission diversity techniques may also be used in accordance with stagger casting; in other words, each of the complementary or overlapping audiovisual streams may be sent at a specific time delay or on a different frequency from one another. As noted above, nested stream encoding can also be used in combination with stagger casting. It should further be noted that, in a sense, nested stream encoding and stagger casting can both be considered special cases of main stream augmentation.

In 310, control information including commands for associating the first error correction coding information with the first audiovisual information and commands for associating the second error correction coding information with the second audiovisual information may be generated. The control information may indicate which error correction coding information is to be associated with which audiovisual information, and may indicate where in the pluralities of packets the error correction coding information and the audiovisual information to be associated are to be found. In other words, the control information may be usable by a mobile device receiving the first plurality of packets and the second plurality of packets to determine which error correction information in the second plurality of packets to use to process a particular block of audiovisual information from the first plurality of packets. The commands in the control information may also indicate if multiple blocks of audiovisual information are to be associated with each other, e.g., if the first and third pluralities of packets contain complementary or overlapping information. Similarly, the error correction coding associated with each audiovisual stream may be associated with another (complementary or overlapping) audiovisual stream, either explicitly by the commands in the control information, or inherently due to the association of the complementary or overlapping audiovisual streams with each other. In short, the commands in the control information may effectively form a cross stream association.

The control information may be in any number of formats, or may be divided into multiple formats. For example, in the ATSC M/H system, there may be a Fast Information Channel (FIC) and a Transmission Protocol Channel (TPC). Each of these may include part of the control information. In one embodiment, the presence of an augmented main stream (e.g., the presence of additional error correction information in the second plurality of packets) may be signaled by a command in the TPC, while the location, length, and form (and/or other information) of the additional error correction may be signaled by commands in the FIC. Specific embodiments of TPC and FIC signaling and syntax are shown in FIGS. 16-18 and described with respect thereto, however, it should be noted that these are exemplary only, and other kinds of control information (or other syntax for the TPC and/or the FIC) for associating the error correction coding information in the second plurality of packets with the audiovisual information in the first plurality of packets are also possible. If any of the information to be associated is separated in time and/or frequency (i.e., if transmission of the information is time and/or frequency diverse), the control information may also indicate this.

In 312, a fifth plurality of packets including the control information may be generated. The control information may be packetized in a similar way as the first plurality of packets (and the other pluralities of packets). In an alternative embodiment, some or all of the control information may be included in one or more of the other pluralities of packets, rather than separately in a fifth plurality of packets. However, in some embodiments, sending the control information separately may be beneficial, e.g., in the case where both stationary devices and mobile devices should be able to use the audiovisual stream(s), but stationary devices might not be able to use the control information; in this case, sending the control information with the audiovisual information could potentially render the audiovisual stream unusable for the stationary devices.

In 314, the plurality of packets, including the first, second, third, fourth, and fifth pluralities of packets may be transmitted. Transmission of these pluralities of packets may comprise multiplexing the first, second, third, fourth, and fifth pluralities of packets (multiplexing the first, second and third streams). Multiplexing of these different packets or streams may be performed based on a ratio of the relative bandwidth allocations of the respective pluralities of packets (or streams). In one embodiment corresponding to continuous mode, multiplexing these different packet streams comprises ordering the packets to distribute them evenly according to their relative bandwidth. In another embodiment corresponding the burst mode, the different packet streams are aggregated in separate bursts preceded by control information (aggregated in its own burst) to indicate the start position of the remaining bursts. The multiplexing may operate to reduce transmission overhead. In one embodiment, the transmission method transmits size information regarding the bandwidth allocations of the various packet streams, wherein the size information is useable at the receiver to demultiplex the received packet streams.

FIG. 4—Receive Flowchart

FIG. 4 is a flowchart depicting a method for receiving and presenting audiovisual information. The method may be performed by a mobile device such as described above and shown in FIG. 1, e.g., portable computer systems (laptops), wireless telephones (e.g., Blackberrys, iphones, etc.), personal digital assistants, television equipment configured in vehicles, and other types of portable devices capable of displaying received audiovisual information. Alternatively, in some embodiments, the method may be performed by a stationary device, such as also shown in FIG. 1 and described above, e.g., a conventional television, such as liquid crystal display (LCD display) television, a plasma display television, etc. It should be noted that, according to various embodiments, one or more of the steps may be omitted, repeated, or performed in a different order than shown in FIG. 2 and described below.

In 402, a first plurality of packets including audiovisual information may be received. The packets containing audiovisual information may include one or more content streams intended for mobile and/or stationary devices. In one embodiment, the packets may be generated according to the ATSC (Advanced Television Standards Committee) DTV (digital television) standard containing one or more digital television channels intended for stationary receivers (e.g., televisions); alternatively, or in addition, the packets may contain one or more digital television channels intended for mobile/handheld (M/H) receivers. The packets containing audiovisual information may also include error correction coding, such as forward error correction; this may take any number of forms, including but limited to RS encoding, Trellis encoding, CRCs, or other forms of error correction coding, including a combination of multiple methods.

In 404, a second plurality of packets including error correction coding information for the audiovisual information may be received. The error correction coding information in the second plurality of packets may be any type of error correction coding, as desired; thus, it may be the same as or different than the error correction coding information in the first plurality of packets. The error correction information in the second plurality of packets may be supplemental to any error correction information in the first plurality of packets. In one embodiment, both the first and second pluralities of packets may include coding information from a four state convolutional encoder, such as shown in FIG. 6 and described with respect thereto.

In a specific embodiment, the packets including the audiovisual information may include a systematic (i.e., including the input (audiovisual) data) coding scheme, while the packets including the additional error correction coding information may include a complementary non-systematic (i.e., including only coded (error correction) data) coding scheme. In other words, the error correction coding information may be an augmentation to the main stream (e.g., the audiovisual information).

In another embodiment, the packets including the additional error correction information may include more than one complementary non-systematic coding scheme. In other words, there may be a systematic coding scheme in the audiovisual stream and two or more error correction coding patterns, complementary to each other and to the systematic coding scheme in the audiovisual stream, in a separate error correction stream. In other words, the error correction coding information may be encoded in multiple nested streams.

In some embodiments, two or more of these audiovisual and/or error correction streams may be separated in time and/or frequency. In other words, one stream may be received at one time on a certain frequency, while another stream may be received at a specified time delay and/or on a different frequency. In other words, there may be transmission diversity between the audiovisual information and the error correction coding information.

In 406, a third plurality of packets including control information which includes commands for associating the error correction coding with the audiovisual information may be received. The control information may indicate which error correction coding information is associated with which audiovisual information, and may indicate where in the pluralities of packets the error correction coding information and the associated audiovisual information are to be found. In other words, the control information may be usable by the mobile device to determine which error correction information in the second plurality of packets to use to process a particular block of audiovisual information from the first plurality of packets. In short, the commands in the control information may effectively form a cross stream association.

The control information may be in any number of formats, or may be divided into multiple formats. For example, in the ATSC M/H system, there may be a Fast Information Channel (FIC) and a Transmission Protocol Channel (TPC). Each of these may include part of the control information. In one embodiment, the presence of an augmented main stream (e.g., the presence of additional error correction information in the second plurality of packets), or nested streams, may be signaled in the TPC, while the location, length, and form (and/or other information) of the additional error correction may be signaled in the FIC. Specific embodiments of TPC and FIC signaling and syntax are shown in FIGS. 16-18 and described with respect thereto, however, it should be noted that these are exemplary only, and other kinds of control information (or other syntax for the TPC and/or the FIC) for associating the error correction coding information in the second plurality of packets with the audiovisual information in the first plurality of packets are also possible. If any of the information to be associated is separated in time and/or frequency (i.e., if transmission of the information is time and/or frequency diverse), the control information may also indicate this.

In 408, the error correction coding information may be associated with the audiovisual information based on the control information. The mobile device may associate specific error correction coding information with a specific portion of audiovisual information based on the commands in the control information, e.g., based on the TPC and FIC commands.

In 410, the audiovisual information, including the error correction coding information associated with the audiovisual information, may be processed. Processing the audiovisual information may include performing the inverse of any steps taken in preparing the data for transmission and/or packetizing the data, e.g., demultiplexing the data, decoding any error correction information, decoding the audio and video data, etc. Decoding the error correction information may include both decoding any error correction information received in the first plurality of packets (i.e., with the audiovisual information), and any error correction information received in the second plurality of packets (i.e., separated from the audiovisual information) that is associated with the audiovisual information based on the commands in the control information.

In 412, the processed audiovisual information may be presented. Presenting the processed audiovisual information may include presenting video information on a display and/or presenting audio information on one or more speakers.

FIG. 5—Extended Receive Flowchart

FIG. 5 is a flowchart depicting a method for receiving and presenting audiovisual information. The method may be performed by a mobile device such as described above and shown in FIG. 1, e.g., portable computer systems (laptops), wireless telephones (e.g., Blackberrys, iphones, etc.), personal digital assistants, television equipment configured in vehicles, and other types of portable devices capable of displaying received audiovisual information. Alternatively, in some embodiments, the method may be performed by a stationary device, such as also shown in FIG. 1 and described above, e.g., a conventional television, such as liquid crystal display (LCD display) television, a plasma display television, etc. It should be noted that, according to various embodiments, one or more of the steps may be omitted, repeated, or performed in a different order than shown in FIG. 2 and described below.

In 502, a first plurality of packets including first audiovisual information may be received. The packets containing the first audiovisual information may include one or more content streams intended for mobile and/or stationary devices. In one embodiment, the packets may be generated according to the ATSC (Advanced Television Standards Committee) DTV (digital television) standard containing one or more digital television channels intended for stationary receivers (e.g., televisions); alternatively, or in addition, the packets may contain one or more digital television channels intended for mobile/handheld (M/H) receivers. The packets containing the first audiovisual information may also include error correction coding, such as forward error correction; this may take any number of forms, including but limited to RS encoding, Trellis encoding, CRCs, or other forms of error correction coding, including a combination of multiple methods.

In 504, a second plurality of packets including first error correction coding information for the first audiovisual information may be received. The first error correction coding information may be any type of error correction coding, as desired; thus, it may be the same as or different than the error correction coding information (if any) in the first plurality of packets. The first error correction information may be supplemental to any error correction information in the first plurality of packets. In one embodiment, both the first and second pluralities of packets may include coding information from a four state convolutional encoder, such as shown in FIG. 6 and described with respect thereto.

In a specific embodiment, the packets including the first audiovisual information may include a systematic coding scheme, while the packets including the first error correction coding information may include a complementary non-systematic coding scheme. In other words, the first error correction coding information may be an augmentation to the main stream (e.g., the first audiovisual information).

In another embodiment, the packets including the additional error correction information may include more than one complementary non-systematic coding scheme. In other words, there may be a systematic coding scheme in the audiovisual stream and two or more error correction coding patterns, complementary to each other and to the systematic coding scheme in the audiovisual stream, in a separate error correction stream. In other words, the first error correction coding information may be encoded in multiple nested streams.

In some embodiments, two or more of these audiovisual and/or error correction coding patterns may be separated in time and/or frequency. In other words, one stream may be received at one time on a certain frequency, while another stream may be received at a specified time delay and/or on a different frequency. In other words, there may be transmission diversity between the audiovisual information and the error correction coding information.

In 506, a third plurality of packets including second audiovisual information may be received. The second audiovisual information may be complementary to, partially complementary to and partially overlapping with, or completely overlapping with the first audiovisual information. In general, the first and second audiovisual information may benefit from being associated with each other; for example, the first and second audiovisual information may build on each other to produce a more robust signal.

In 508, a fourth plurality of packets including second error correction coding information for the second audiovisual information may be received. The second error correction coding information may be any type of error correction coding, as desired; thus, it may be the same as or different than the error correction coding information in the third plurality of packets. The error correction information in the fourth plurality of packets may be supplemental to any error correction information in the third plurality of packets. In one embodiment, both the third and fourth pluralities of packets may include coding information from a four state convolutional encoder, such as shown in FIG. 6 and described with respect thereto.

In a specific embodiment, the third plurality of packets may include a systematic coding scheme, while the fourth plurality of packets may include a complementary non-systematic coding scheme. Thus, in some embodiments, the first audiovisual information may be the input data in a systematic coding scheme, while the second audiovisual information may be complementary or overlapping input data in a complementary or overlapping coding scheme. The coded data (error correction information) for the complementary or overlapping coding schemes may be complementary.

The audiovisual streams (first and third pluralities of packets) may include this complementary error correction information; alternatively, or in addition, the complementary error correction coding information may be the error correction information in the second and fourth pluralities of packets. In some embodiments, the error correction coding information in the second and/or fourth packets may also be systematic coding schemes. Thus, in some embodiments, there may be a number of streams of overlapping or complementary audiovisual streams with complementary error correction coding information. In another possible embodiment, the error correction information in the second and fourth pluralities of packets may be non-systematic, but still complementary. In this case, there would be nested stream encoding in addition to the multiple complementary/overlapping audiovisual streams.

In other words, the audiovisual data may be either overlapping or complementary, while the error correction information may be complementary. In this way, it may be possible for a device to receive either the first packets with the first audiovisual information, or the third packets with the second audiovisual information, and use the audiovisual information even if the complementary/overlapping audiovisual information isn't received. On the other hand, if all of the complementary/overlapping audiovisual information is received, the complementary coding data may provide additional robustness, allowing for a lower receive threshold. The case where multiple streams with overlapping audiovisual data with complementary error correction information are transmitted is referred to herein as 'stagger casting' and is described in further detail as it could be implemented in one embodiment with respect to FIGS. 23-25. Transmission diversity techniques may also be used in accordance with stagger casting; in other words, each of the complementary or overlapping audiovisual streams may be sent at a specific time delay or on a different frequency from one another. As noted above, nested stream encoding can also be used in combination with stagger casting. It should further be noted that, in a sense, nested stream encoding and stagger casting can both be considered special cases of main stream augmentation.

In 510, a fifth plurality of packets including control information which includes commands for associating the first error correction coding information with the first audiovisual information and commands for associating the second error correction coding information with the second audiovisual information may be received. The control information may indicate which error correction coding information is to be associated with which audiovisual information, and may indicate where in the pluralities of packets the error correction coding information and the audiovisual information to be associated are to be found. In other words, the control information may be usable by the mobile device to determine which error correction information in the second plurality of packets to use to process a particular block of audiovisual information from the first plurality of packets. The commands in the control information may also indicate if multiple blocks of audiovisual information are to be associated with each other, e.g., if the first and third pluralities of packets contain complementary or overlapping information. Similarly, the error correction coding associated with each audiovisual stream may be associated with another (complementary or overlapping) audiovisual stream, either explicitly by the commands in the control information, or inherently due to the association of the complementary or overlapping audiovisual streams with each other. In short, the commands in the control information may effectively form a cross stream association.

The control information may be in any number of formats, or may be divided into multiple formats. For example, in the ATSC M/H system, there may be a Fast Information Channel (FIC) and a Transmission Protocol Channel (TPC). Each of these may include part of the control information. In one embodiment, the presence of an augmented main stream (e.g., the presence of additional error correction information in the second plurality of packets) may be signaled by a command in the TPC, while the location, length, and form (and/or other information) of the additional error correction may be signaled by commands in the FIC. Specific embodiments of TPC and FIC signaling and syntax are shown in FIGS. 16-18 and described with respect thereto, however, it should be noted that these are exemplary only, and other kinds of control information (or other syntax for the TPC and/or the FIC) for associating the error correction coding information in the second plurality of packets with the audiovisual information in the first plurality of packets are also possible. If any of the information to be associated is separated in time and/or frequency (i.e., if transmission of the information is time and/or frequency diverse), the control information may also indicate this.

In 512, the first error correction coding information may be associated with the first audiovisual information based on the control information, while in 514, the second error correction coding information may be associated with the second audiovisual information based on the control information. The mobile device may associate specific error correction coding information with a specific portion of audiovisual information based on the commands in the control information, e.g., based on the TPC and FIC commands.

In 516, the first and second audiovisual information, including the first and second error correction coding information associated with the first and second audiovisual information, may be processed. Processing the audiovisual information may include performing the inverse of any steps taken in preparing the data for transmission and/or packetizing the data, e.g., demultiplexing the data, decoding any error correction information, decoding the audio and video data, etc. Decoding the error correction information may include both decoding any error correction information received in the first plurality of packets (i.e., with the first audiovisual information), and any error correction information received in the second plurality of packets (i.e., separated from the first audiovisual information) that is associated with the first audiovisual information based on the commands in the control information. Similarly, any error correction coding information received in the third plurality of packets may be decoded along with any associated error correction coding information received in the fourth plurality of packets. In some embodiments, because of the (explicit or implicit) association of the second error correction coding information with the first audiovisual information, the second error correction coding information may be used in processing the first audiovisual information. Similarly, the first error correction information may be used in processing the second audiovisual information. Likewise, if the first and second audiovisual information include complementary error correction coding information, they may be processed together. Such combinations of associated error correction coding information during processing may result in a stronger, more robust audiovisual stream for presentation, and/or may make it possible to receive and present audiovisual information at the mobile device even under adverse receiving conditions.

In 518, the processed audiovisual information may be presented. Presenting the processed audiovisual information may include presenting video information on a display and/or presenting audio information on one or more speakers.

FIG. 6—Four State Convolutional Outer Code

FIG. 6 illustrates a systematic convolutional encoding scheme with R=1/5 and K=3 and a corresponding coding structure. Based on this common structure, a variety of puncturing patterns can be used to derive multiple rates (R=n/k, where there are n-input bits and k-output bits). Various puncturing patterns can also be used in accordance with cross-stream association to create complementary coding patterns separated in time or frequency. While FIG. 6 shows a particular convolutional encoding scheme which will be referred to for convenience herein, it should be noted that other encoding schemes (e.g., other convolutional encoding schemes or other types of error correction coding schemes) may be used in addition or instead of the scheme shown in FIG. 6 and described herein.

Figure 7:
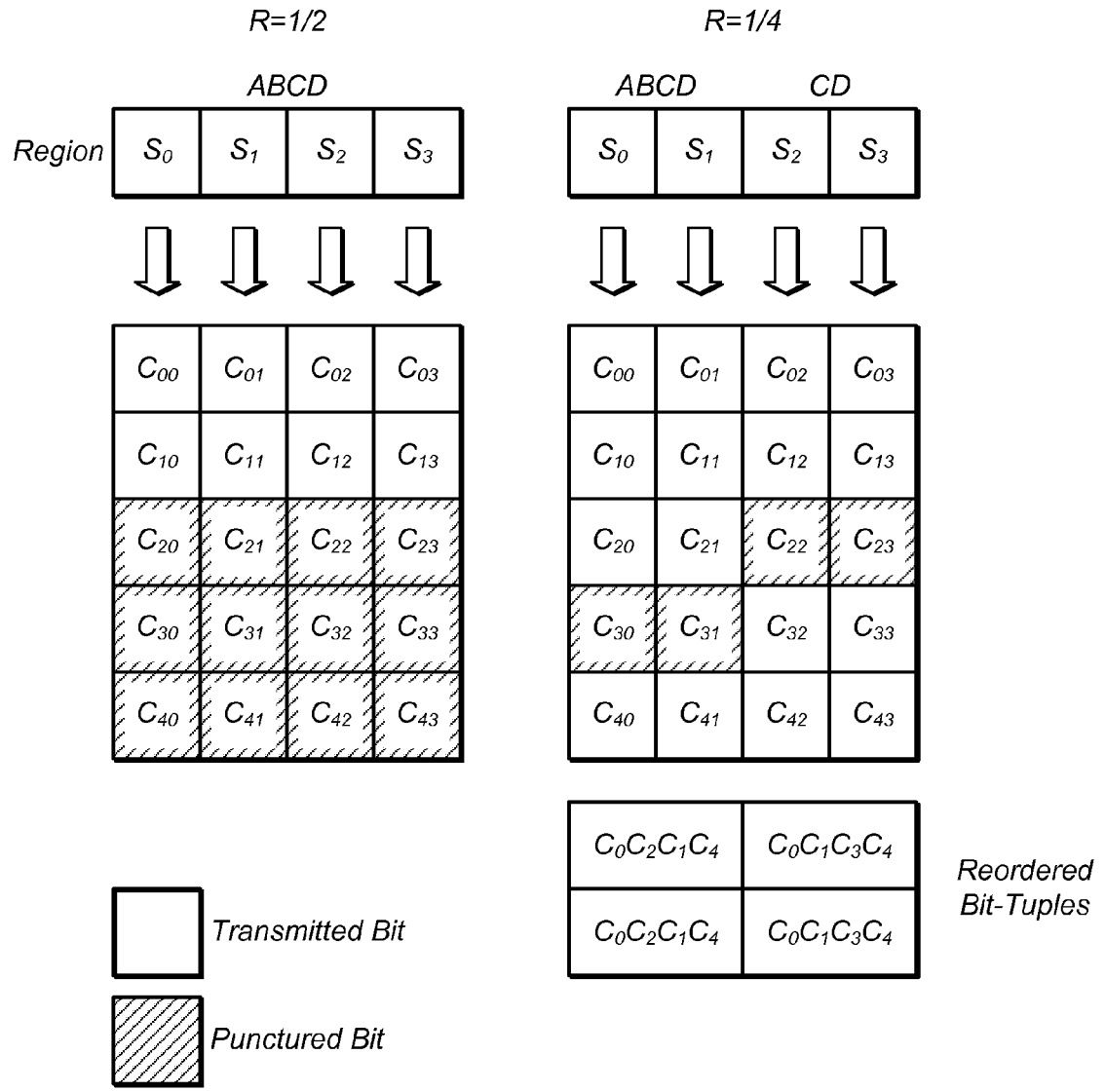
FIG. 7 is an illustration of two basic puncturing patterns resulting in coding rates of R=1/2 and R=1/4 according to one embodiment.

FIG. 7—Basic Puncturing Patterns, Rates 1/2, 1/4

FIG. 7 illustrates two basic puncturing patterns that can be used with the convolutional encoding scheme shown in FIG. 6. As shown, for R=1/2, 2 bits are transmitted for every input, while, for R=1/4, 4 bits are transmitted for every input bit. Given that the outer convolutional encoder is systematic, the input bits are passed to the output unmodified, and reordered in bit-tuples along with the coded data, as shown in FIG. 7.

Figure 8:
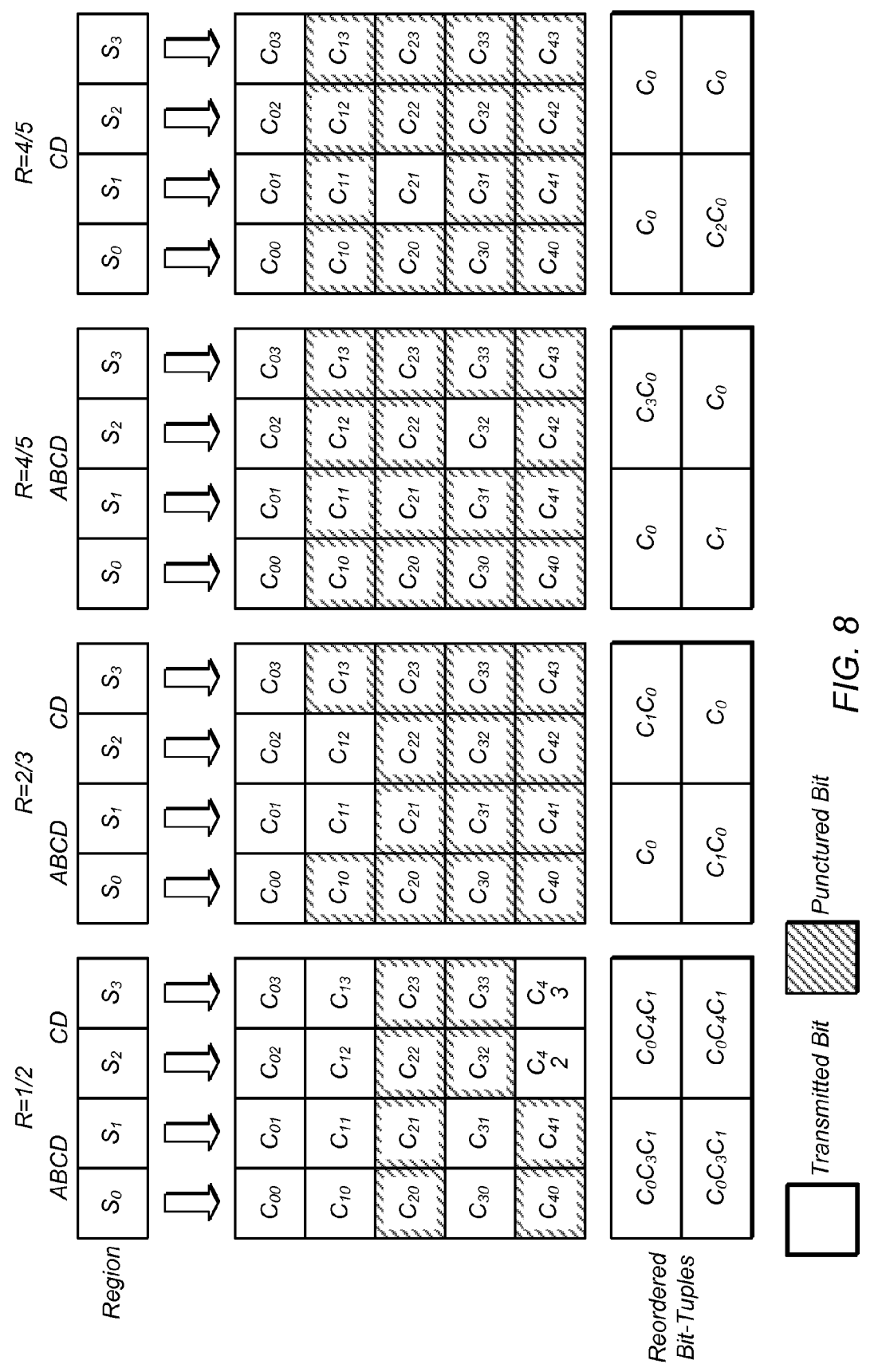

FIG. 8—Additional Puncturing Patterns, Rates 1/3, 2/3, 4/5

FIG. 8 illustrates several additional puncturing patterns that can be used with the convolutional encoding scheme shown in FIG. 6. As shown, the various puncturing patterns can be used to produce rates of 1/3, 2/3, or 4/5. Other puncturing patterns, producing other rates, are also possible.

Figure 9:
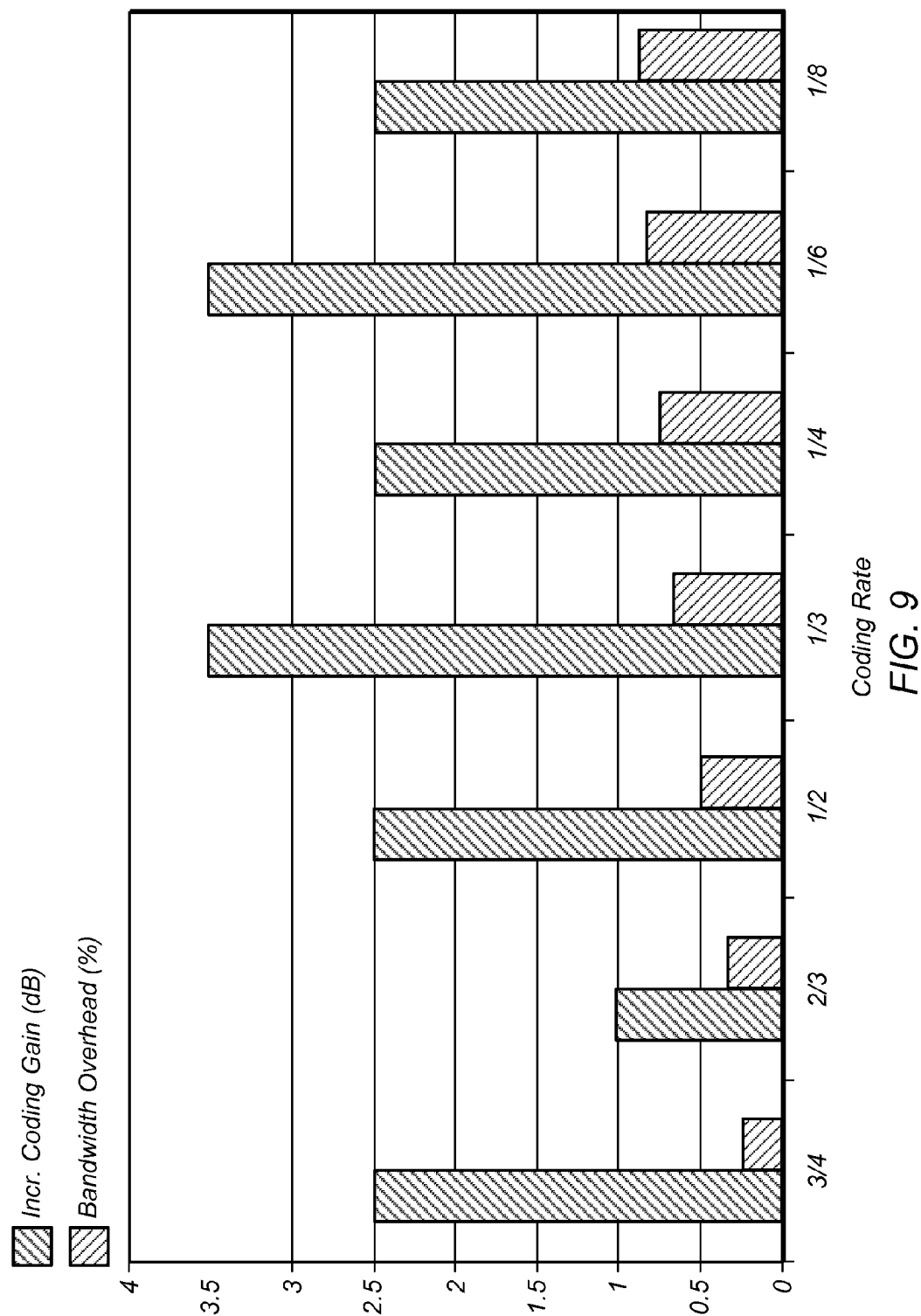
FIG. 9 is a graph illustrating incremental coding gain and bandwidth overhead for a variety of coding rates according to one embodiment.

FIG. 9—Incremental Gain vs. Overhead

FIG. 9 is a graph depicting the incremental gain (i.e., the additional gain over the previous coding rate) and the associated percentage of bandwidth thereby dedicated to overhead for a variety of coding rates. The availability of a number of rates opens up the possibility of dynamically changing the coding rate used to encode data. For example, depending on the transmission and/or reception conditions, it may variously be desirable to use a lower coding rate (e.g., 4/5, or 2/3) if conditions are relatively good and less gain is required, thereby saving bandwidth overhead. Alternatively, if the conditions are less stable (for example, if the receiver is moving in a vehicle at high speeds), and additional gain is desirable, a higher coding rate such as 1/3 or 1/4may be desirable, at the cost of increased bandwidth overhead.

Figure 10:
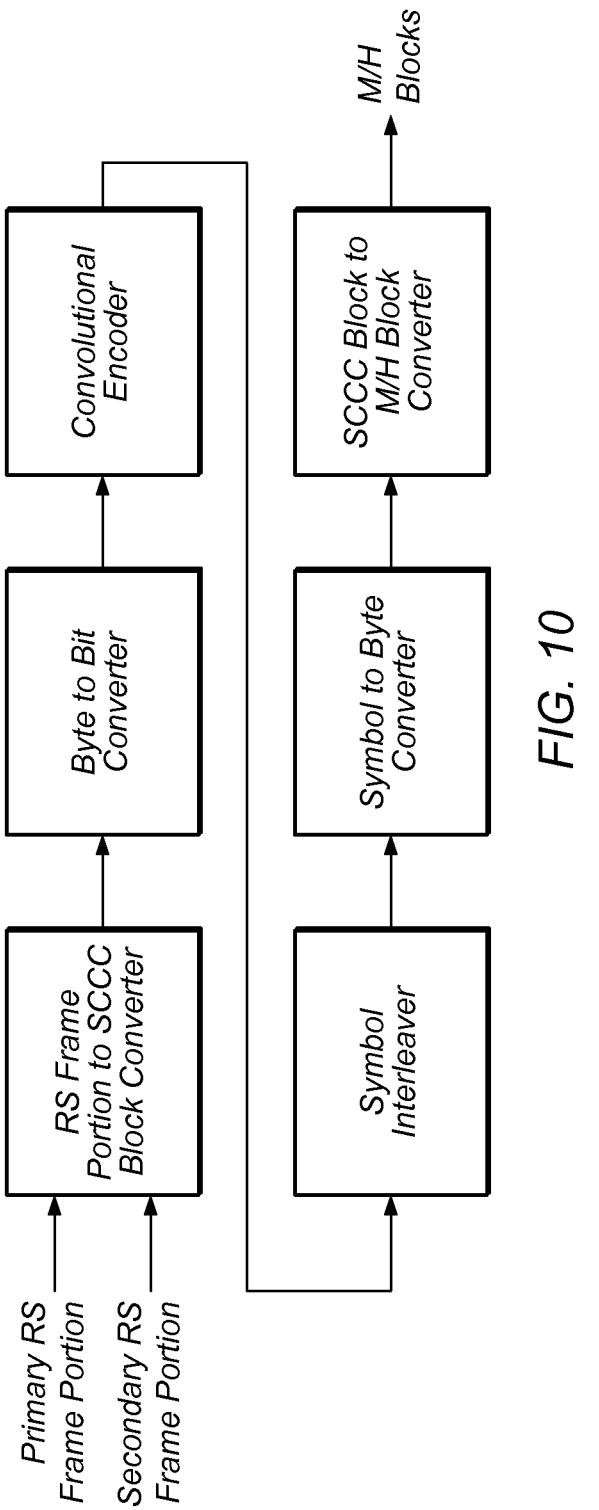
FIG. 10 is a block diagram illustrating a block processor according to one embodiment.

FIG. 10—Block Processor

FIG. 10 is a diagram illustrating the block processing involved in producing M/H data blocks, the primary function of which is to provide an outer-encoding concatenated with the standard 8VSB trellis encoding.

FIG. 11—Payload Length

FIG. 11 is a table showing payload length as a function of SCCC Block Mode and Frame Mode (parameters in the TPC channel, which is described below) for each region of an M/H Frame.

FIG. 12—SCCC Output/Input Block Length (SOBL/SIBL)

FIG. 12 is a table showing the SCCC Output Block Length for corresponding SCCC Input Block Lengths at various rates. Each of the additional rates (e.g., R=1/3, R=2/3, R=4/5) can be accommodated provided the SCCC Input Block Length (SIBL) is adjusted to maintain the original SCCC Output Block Length (SOBL) for a given M/H Block.

FIGS. 13A and 13B—Cross Stream Association, Augmented Main Stream Encoding

FIGS. 13A and 13B illustrate ways to stream audiovisual information according to various embodiments. In FIG. 13A, 'main stream data', i.e., data intended for stationary devices, is sent in one stream. The main stream may or may not include its own error correction information according to various embodiments. In addition to the main stream data, there may be a parade for mobile devices, i.e., an audiovisual information stream intended for devices which are configured to use additional error correction coding. A parade, as used herein, refers to a sequence of transmitted M/H slots assigned to carry a particular service. As one example, in the ATSC standard, to accommodate both stationary and mobile devices, there may be a main stream for existing/stationary services and an M/H stream for mobile and/or handheld devices. In prior art approaches, such separate streams may be required in order to transmit audiovisual information to both stationary and mobile devices, because the existing/ stationary devices may not be configured to recognize the M/H stream, while mobile devices may not be able to use the main stream because it doesn't have sufficient error correction coding to enable reliable reception if the mobile device is moving or otherwise in less than ideal reception conditions.

In FIG. 13B, there is still a main stream parade, and a M/H parade including additional error correction information, however, the M/H parade doesn't include separate audiovisual information. Since the additional error correction is still sent in a separate parade than the main stream, stationary/ existing devices may be able to use the main stream audiovisual information even if they are not configured to use the additional error correction information. There may also be control information, usable by mobile devices, for linking or associating the additional error correction information to corresponding information in the main stream. In this way, mobile devices may also be able to use the main stream audiovisual information. Thus, by sending the audiovisual information in a separate stream than the error correction coding information, but associating them, both mobile and stationary devices may be able to use the same audiovisual information, potentially eliminating the redundancy of multiple audiovisual streams, as for example shown in FIG. 13A. The extra bandwidth that this frees up is indicated by the blank space shown at the end of each parade in FIG. 13B.

The association of information between multiple data streams is what is referred to herein as cross stream association. In particular, when cross stream association is used to associate additional error correction information with a main audiovisual information stream, the resulting data stream is what is referred to herein as an augmented main stream.

Figure 14:
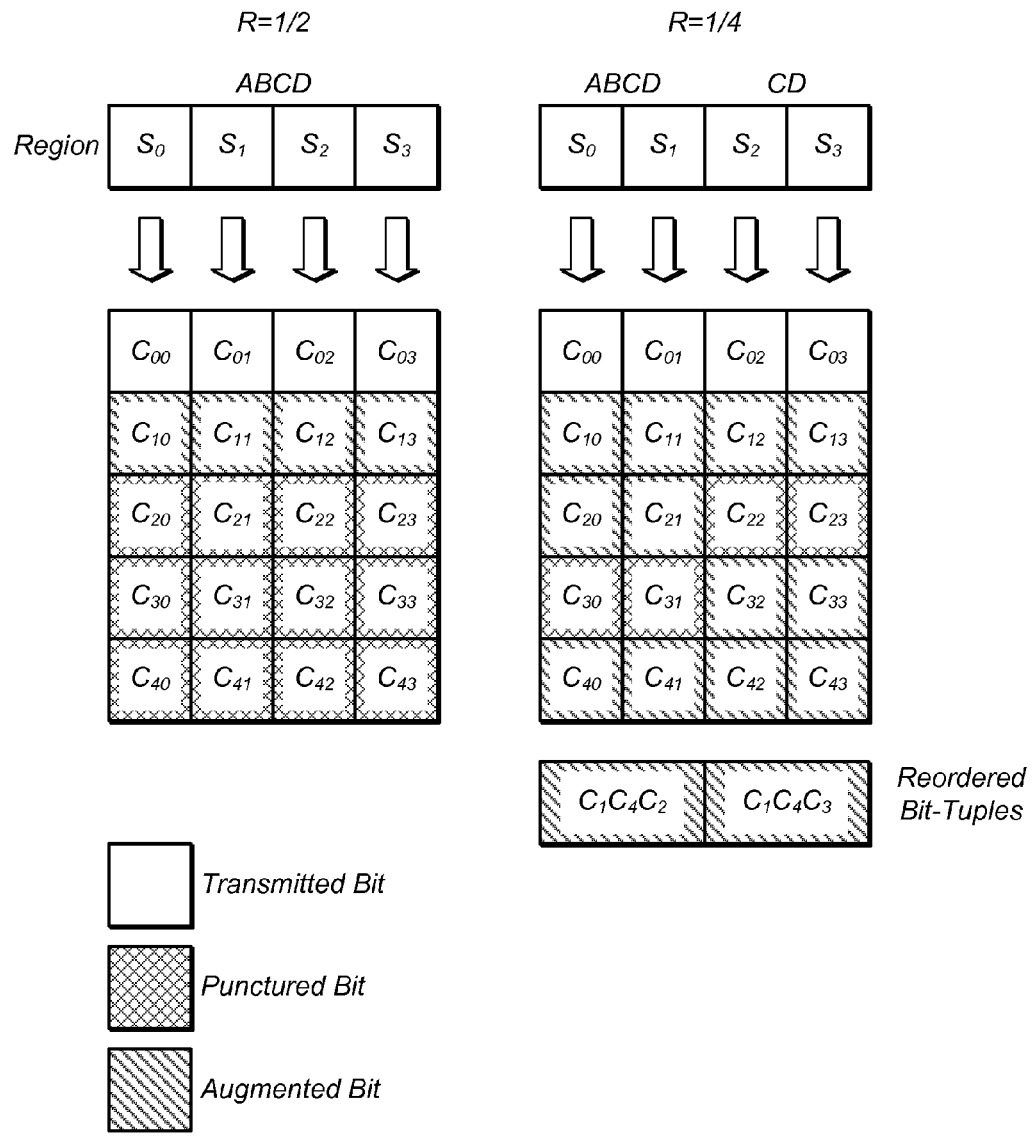
FIG. 14 is an illustration of an R=1/2 and an R=1/4 coding scheme in accordance with main stream augmentation according to one embodiment.

FIG. 14—Augmented Main Stream Encoding with a Convolutional Encoder

FIG. 14 illustrates two possible coding structures resulting from augmenting the main stream. The transmitted bits represent the data bits transmitted in the main stream. As shown, they may correspond to the input (data) bits in a systematic convolutional encoder, e.g., the convolutional coding scheme shown in FIG. 6. The same coding scheme may be used to produce a pattern (e.g., complementary to the data stream) of error correction coding bits. These "augmented" bits may be sent in a separate stream than the main stream, e.g., as described with regard to FIG. 13B. The augmented bits may be associated with the appropriate data bits (e.g., with control information), such that a mobile device may able to retrieve the error correction coding bits and the data bits and thereby effectively receive a 1/2, 1/4, or otherwise coded coding structure. A stationary device which is unable to use the additional error correction information may simply ignore (in some embodiments, it may be unable to recognize) the control information associating the augmented bits with the main stream data bits. The stationary device may thus also be able to use the main stream service; in other words, augmented stream encoding may enable data sharing between services, e.g., in one embodiment, both legacy ATSC services and ATSC M/H services may be able to share the same main stream data.

Figure 15:
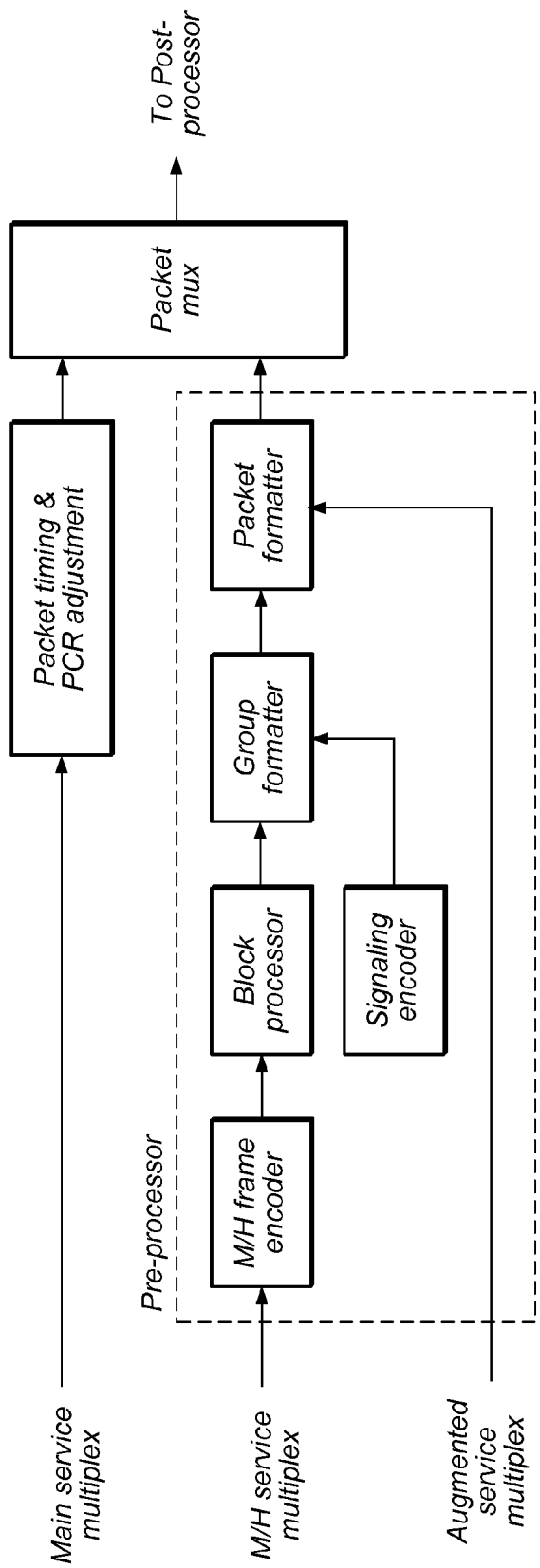
FIG. 15 is an illustration of an augmented service multiplex according to one embodiment.

FIG. 15—Augmented Service Multiplex

FIG. 15 illustrates one possible embodiment of an augmented service multiplex. As shown, the augmented service data may be transported in a separate parade, bypassing portions of M/H processing, such as a frame encoder, convolutional coder, null encapsulation, and signaling. As such, the main service data may remain accessible to a legacy receiver while also benefiting from addition training to permit reliable mobile reception.

Figure 16A:
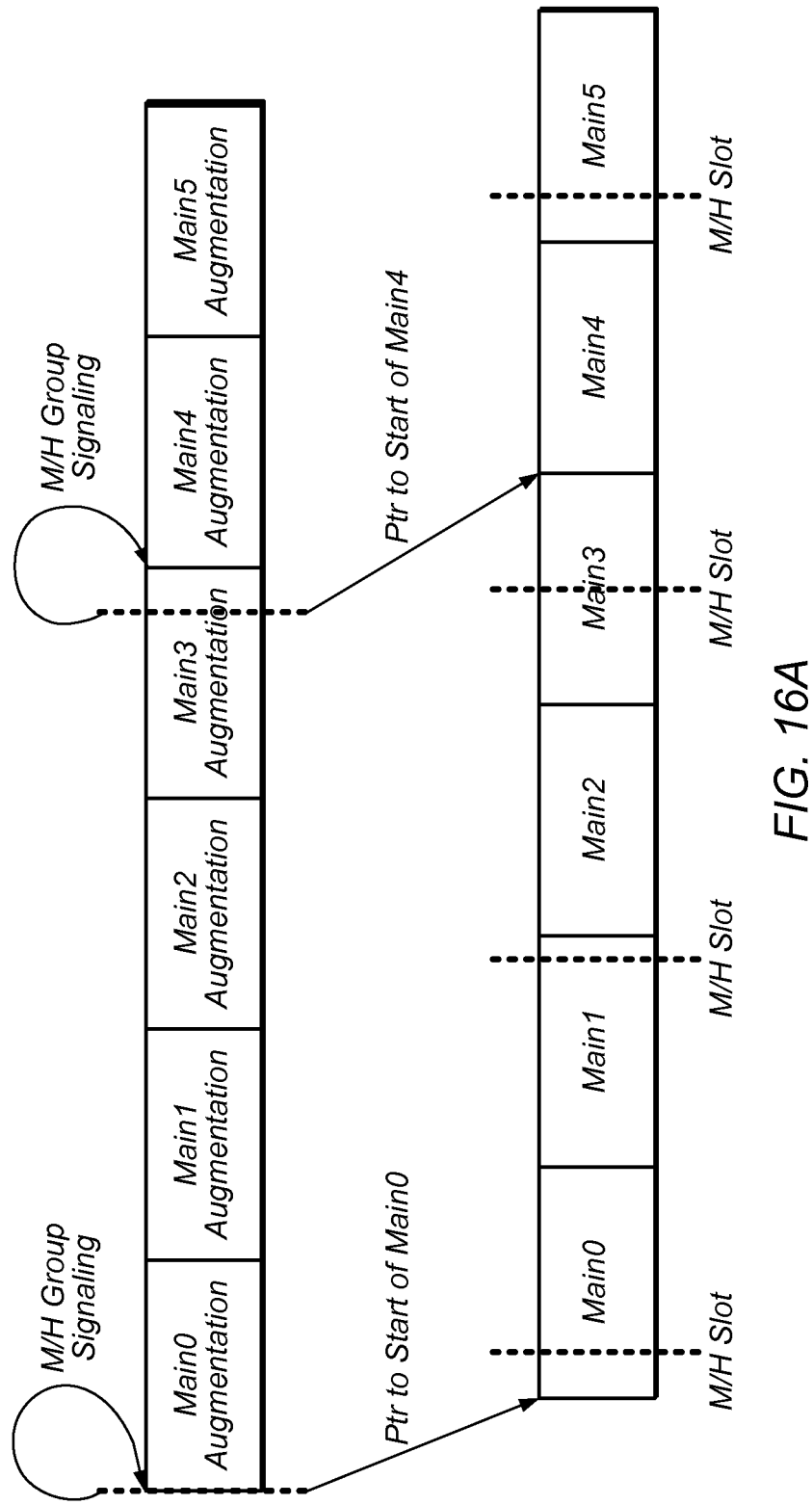
FIGS. 16A and 16B are illustrations showing the organization of an augmented stream according to one embodiment.
Figure 16B:
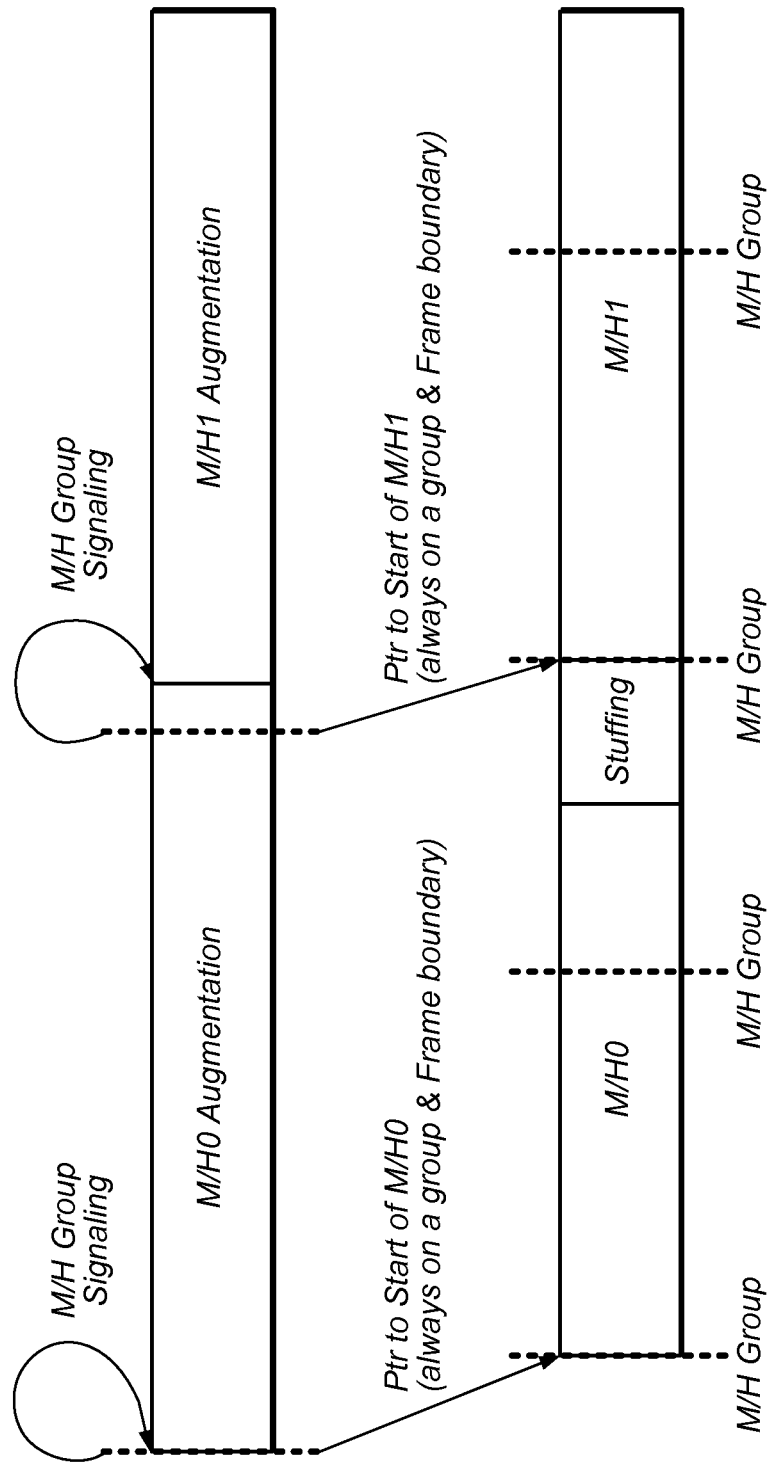

FIGS. 16A and 16B—Augmented Stream Organization

A Fast Information Channel (FIC) may be used to enable transmission of management layer controls. The FIC may operate under a transport layer, in some embodiments providing channel content type but not content configuration. The FIC can be used to notify a receiver where to locate stream content and how to use that content in maximizing system performance. In one embodiment, no zero padding or byte stuffing will be used to align the state of an augmentation block to a particular M/H group. Instead, the start location must be signaled (i.e., because it will vary). The augmentation may occur at regular intervals, allowing a receiver to compare what it calculates to be the next block to what is signaled by the FIC. This may allow the use of multiple FIC packets to improve reliability. FIG. 16A shows an example of how the main service parade may be augmented, with FIC pointers between an augmented stream and associated main stream blocks.

FIG. 16B shows a similar example of pointers between augmented stream blocks and M/H blocks. In this case, instead of being used to augment a main service stream, the augmentation blocks may be used for augmenting an audio-visual information stream intended for mobile devices. Augmentation of an M/H service may require less information than augmentation of a main stream service, e.g., because there may be a Transmission Parameter Channel (TPC) (described in more detail below) which gives the size of the main service and the M/H service may already be synchronized to the start of an M/H frame. However, in some embodiments the redundant information is still signaled, because the signaling must already be allocated to the main stream augmentation. This may allow for future unforeseen expansions.

FIGS. 17A and 17B—Bit Stream Syntax for the FIC Extended Segment and Augmentation Type Mode FIG. 17A shows one possible syntax for an FIC command associating an error correction coding (augmentation) block with a block of audiovisual information. The portions of the command that specifically associate the augmented parade with a service block are shown in bold. In the embodiment shown, these fields may include:

Associated Parade ID (7 bits)—The ID of the associated parade this augmentation is to be applied. The value of 127 is reserved to specify the main service.

Station for service (7 bits)—the station number the service can be found on. This allows for frequency diversity and also allowed for the augmentation to exceed the 19.28 Mbps since it can be placed on a different station.

Augmentation Type (4 bits)—FIG. 17B shows the syntax of this field according to this embodiment. Augmentation type describes the type and/or pattern of the error correction coding.

Length n (4 bits)—specified the number of nibbles (4 bit blocks) in the following field Start of Next Augmentation Block (4n bits)—Value in parade payload bytes from the start of this group location to the start of the next augmentation block.

Block Size of the service (4n Bits)—Count in segments of the number of segments to apply the data to.

Size of Augmentation Block (4n Bits)—Number of bytes for the augmentation.

Start of Payload data (4n Bits)—number of segments from the current group to the start of the payload. This value can be negative so the field is a signal integer. This value should always be 0 for the augmentation of an M/H parade.

This field will also specify where redundant information can be found as an alternative to the current data stream (i.e. diversity). If a stream has no redundancy or augmentation then this value will point to the current service and always be 0.

FIG. 18—Transport Parameter Channel Syntax

In addition to the FIC (which operates under the Transport Layer), there may also be a Transmission Parameter Channel (TPC) for signaling within the PHY layer. The TPC data has the following properties:

Averaging probabilities of multiple data values gives better noise immunity

Frame location information via counters

Frame FEC setup

Fixed in size 31 bits available to (reserved for) future PHY signaling

The TPC can be used for some basic signaling, such as indicating the presence of an augmented parade. In order to signal an augmented M/H parade for either the main service or a robust M/H service, the TPC may be extended to support such new modes by using some of the reserved bits. FIG. 18 shows the TPC syntax according to one embodiment of the present invention, where the fields used to signal the augmented parade are shown in bold. In the embodiment shown, these fields may include:

Parade Type (2 bits)—Specifies the type of parade that is being sent. The possible values and corresponding meanings of this field according to one embodiment are shown in Table 1.

TABLE 1

Parade Type

| Parade Type | Description |
| --- | --- |
| 00 | M/H Encoded |
| 01 | M/H Augmented |
| 10 | Main Augmented |
| 11 | Reserved |

Block Encoder Mode (2 bits)—Specifies the type of block encoder used. The block encoder mode can be used to disable the addition of RS+CRC, as shown in Table 2.

TABLE 2

Block Encoder Mode

| Block Encoder Mode | Description |
| --- | --- |
| 00 | RS + CRC added |
| 01 | None |
| 10 | Reserved |
| 11 | Reserved |

SCCC Outer Code Mode Extensions (2 bits each)—May be used to signal rates (e.g., 1/3, 2/3, 4/5, etc.) beyond the basic 1/4 and 1/2. An SCCC Outer Code Mode Field may signal an extension to an SCCC Outer Code Mode Extension, as shown in Table 3.

TABLE 3

SCCC Outer Code Mode

| SCCC outer code mode | Description |
| --- | --- |
| 00 | The outer code rate of a SCCC Block is 1/2 |
| 01 | The outer code rate of a SCCC Block is 1/4 |

TABLE 3-continued

SCCC Outer Code Mode

| SCCC outer code mode | Description |
|---|---|
| 10 | The outer code rate of a SCCC Block is none (nothing added) |
| 11 | Extend to SCCC_outer_code_mode_extension |

Figure 20:
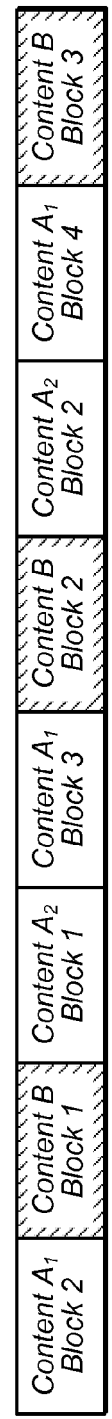
FIG. 20 is an illustration of a content stream with both time diverse and non-time diverse content according to one embodiment.

FIG. 20—Transmission Diversity

FIG. 20 shows various methods of transmission diversity. By sending data separated by a time delay and/or at a different frequency, service reliability can be improved, for example in the presence of burst noise or deep channel fading. Transmission diversity can include simply sending redundant (backup) streams at different delays or frequencies (as shown in and described with respect to FIGS. 20 and 21 below), or may be coupled with the concepts of cross stream association to produce nested stream encoding, wherein multiple complementary streams are transmitted, separated in time and/or frequency, containing additional error correction coding information (non-systematic encoding, i.e., just the error correction coding information without the audiovisual information). The multiple complementary streams may then be associated with the primary data stream (the audiovisual information) at the receiver. Nested Stream Encoding is described in more detail with regard to FIG. 22.

A further extension of transmission diversity is what is referred to herein as stagger casting. In this case, multiple complementary streams of error correction coding information may be transmitted, however, unlike nested stream encoding, each stream may retain sufficient information to permit decoding when received alone. In other words, each stream may employ systematic encoding. In this case, although each stream may be decoded when received alone, reception of multiple such streams (e.g., including complementary error correction coding information, similar to nested stream encoding) may effectively produce a higher coding rate, permitting a lower receive threshold.

FIG. 20—Time Diversity

FIG. 20 shows a data stream with both time-diverse and non-time diverse content. Content A includes primary content blocks A1 as well as backup content blocks A2, which are repeated (redundant) versions of the A1 content blocks. Thus, if a burst destroys A1 content block 2, the backup A2 content block 2 may be used. In the example shown, Content B has no backup content and is not time diverse. While FIG. 20 shows time diversity as it can be used for repeating identical blocks of content, the concept of time diversity can similarly be applied to partially or entirely complementary data blocks, which may be associated with each other using cross stream association (e.g., control information linking the time diverse content) as described herein. Time diversity may be used with or without frequency diversity as desired.

Figure 21:
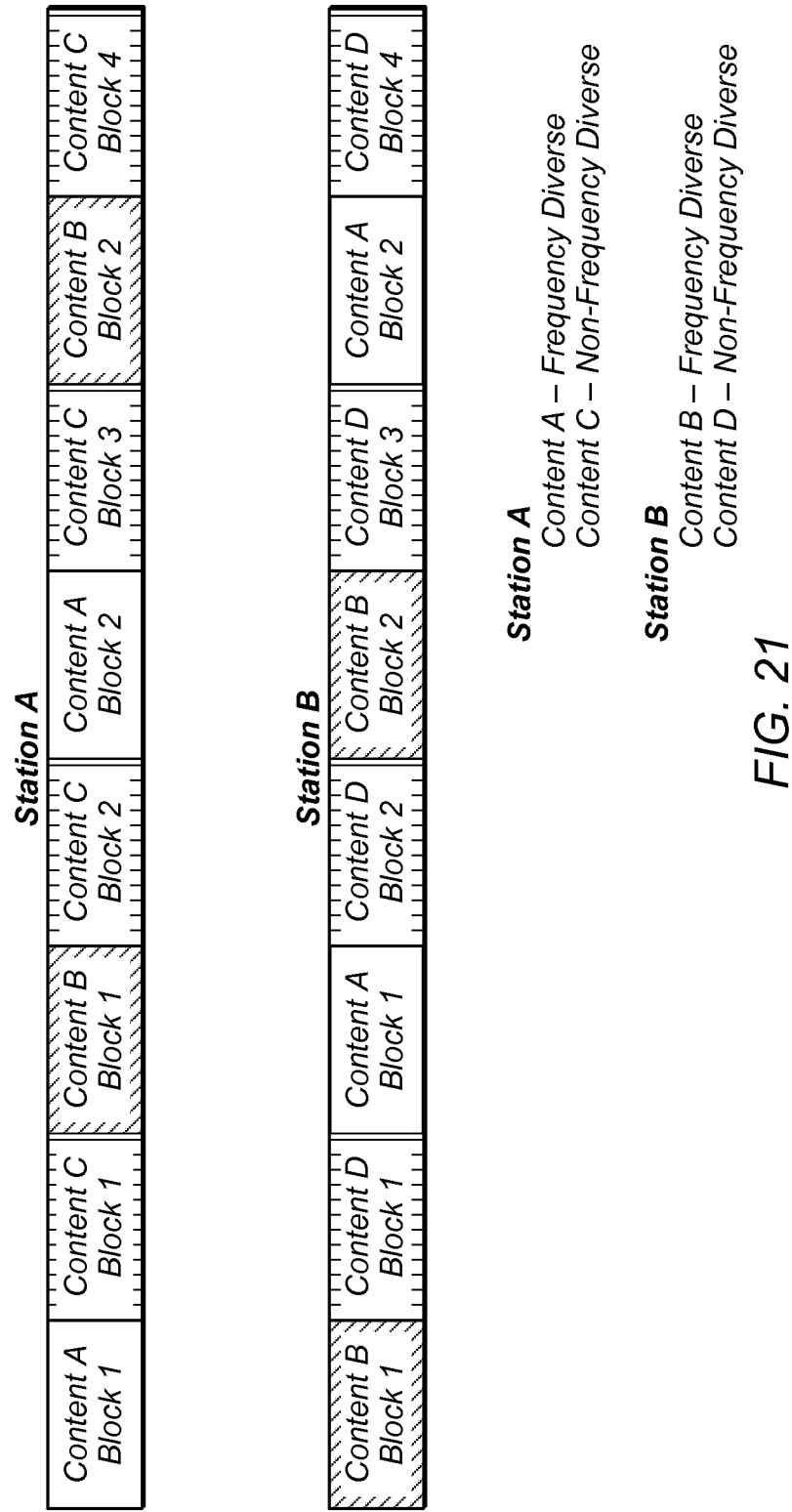
FIG. 21 is an illustration of two content streams on different frequencies, including both frequency diverse and non-frequency diverse content according to one embodiment.

FIG. 21—Frequency Diversity

FIG. 20 shows multiple data streams transmitted on different frequencies, i.e., station A transmits on a first frequency and station B transmits on a second frequency. As shown, Content A and Content B are frequency diverse; that is, both content A and content B are transmitted on both station A and station B. Content C, which is only transmitted on station A, and content D, which is only transmitted on station B, are not frequency diverse. While FIG. 20 shows frequency diversity as it can be used for repeating identical blocks of content, the concept of frequency diversity can similarly be applied to partially or entirely complementary data blocks, which may be associated with each other using cross stream association (e.g., control information linking the time diverse content) as described herein. Frequency diversity may be used with or without time diversity as desired.

Figure 22:
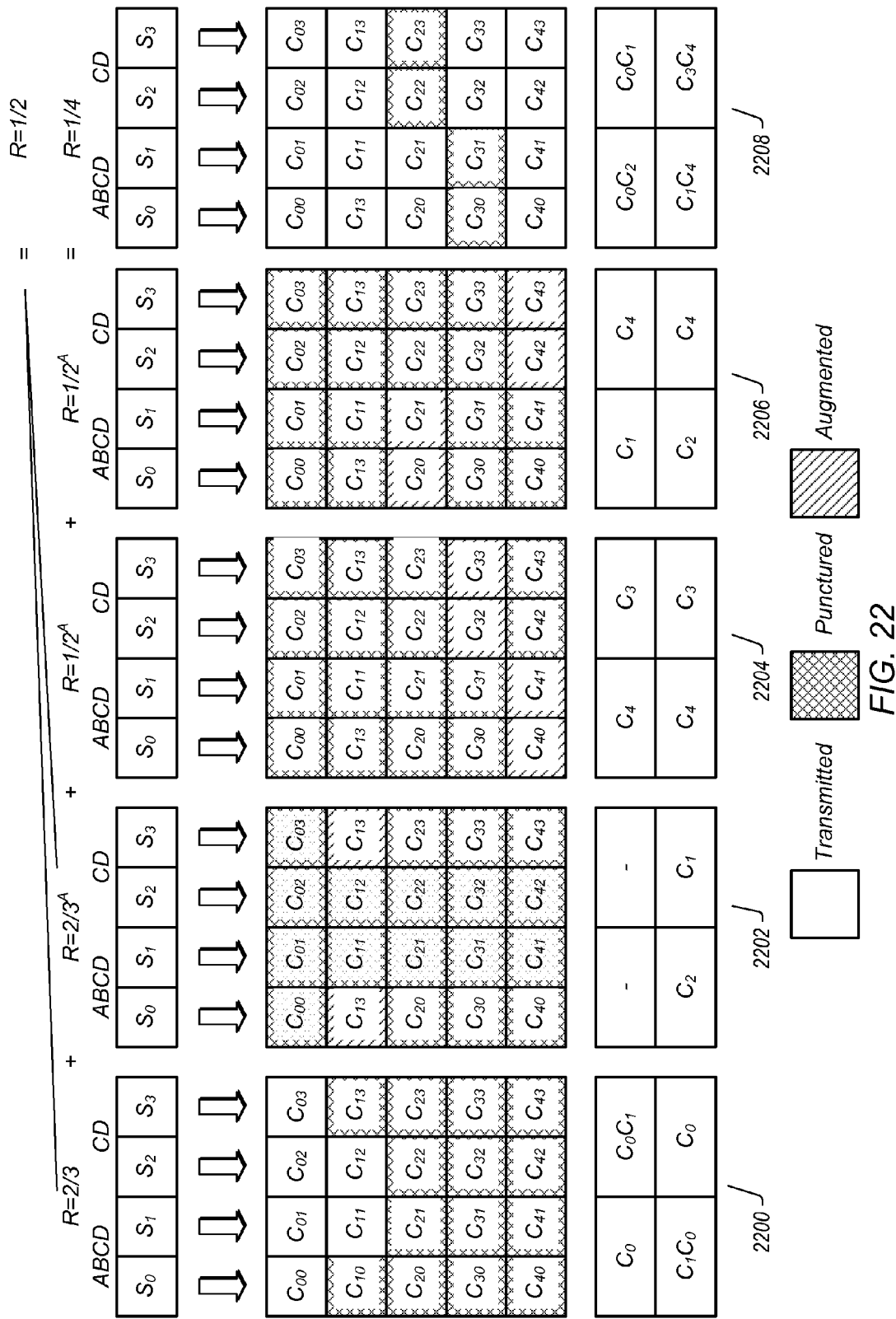
FIG. 22 illustrates complementary coding patterns suitable for nested stream encoding according to one embodiment.

FIG. 22—Nested Stream Encoding

FIG. 22 illustrates one possible embodiment of nested stream encoding. In the example shown, stream 2200 may be the main stream, encoded at a rate of 2/3. Streams 2202, 2204, and 2206 may be non-systematic augmentation streams; in other words, each of these streams may contain only error correction coding bits. Each stream may be transmitted at a separate time and/or frequency. As can be seen, each augmentation stream 2202, 2204, and 2206 is complementary to each other augmentation stream and to the main stream 2200. Thus, if all four streams are received and associated with each other, they may effectively produce a stream 2008 with a higher coding rate of 1/4. Alternatively, it may be noted that even if only the main stream 2200 and the stream 2206 are received, this still effectively increases the coding rate of the main stream from 2/3 to 1/2. Thus, the advantages of time and/or frequency diversity may be achieved without incurring the additional overhead of repeating the content data.

Figure 23:
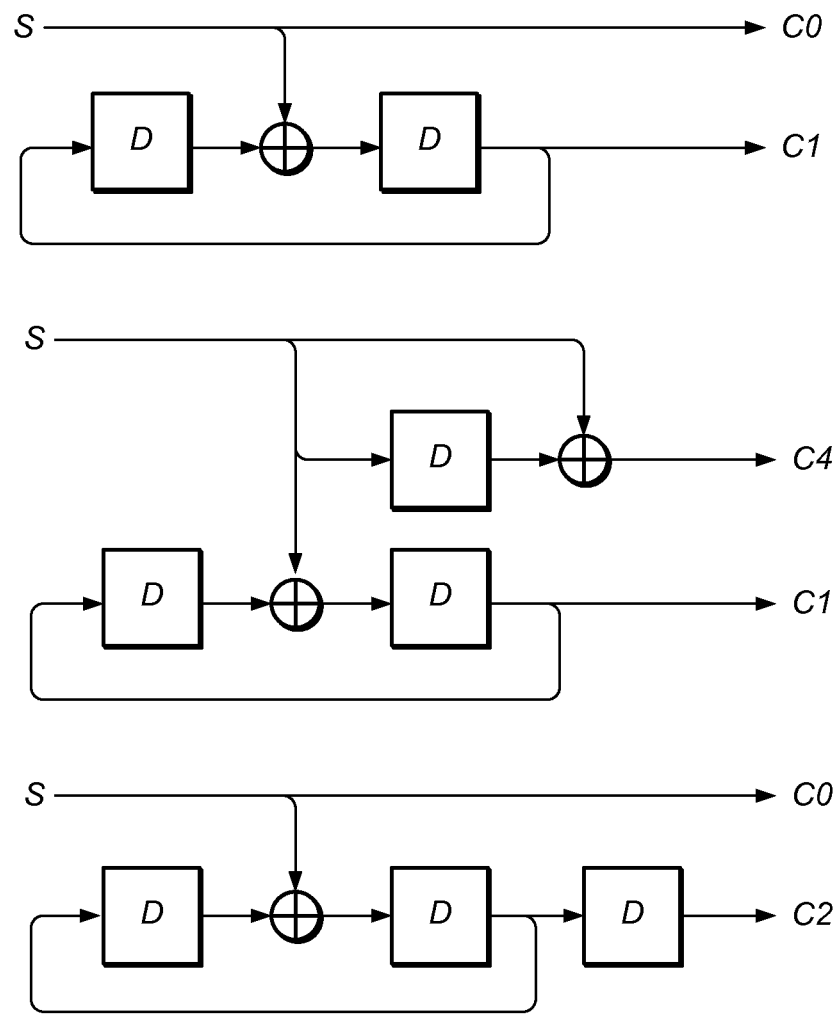
FIG. 23 illustrates equivalent R=1/2 canonical forms of a convolutional encoder according to one embodiment.

FIG. 23—Equivalent M/H R=1/2 Canonical Forms

Stagger casting is a further extension of the nested stream encoding concept, whereby complementary streams are encoded in a way that permits layered encoding coupled with potential for reliable data recovery based on receipt of either stream alone. The streams may be staggered in time and/or frequency to combat temporary signal dropout, as previously discussed. The complementary streams may be encoded with minimal overlap to conserve bandwidth, however, each stream still retains sufficient information (in terms of data (AV information) and code bits (error correction coding information) to enable stand alone data recovery. When both streams are received and associated with one another, the information builds together to permit reception at lower receive thresholds. To do this in the M/H system, slight modifications to the convolutional encoder (e.g., as shown in FIG. 6) may be necessary.

Currently the M/H system offers (C0,C2),(C1,C4) and (C0,C1),(C3,C4) modes for 1/4 rate encoding. For 1/2 rate coding the M/H system offers (C0,C1). It is possible to split the 1/4 rate code (C0,C2),(C1,C4) into two separate streams. The two streams would be (C0,C2) and (C1,C4). FIG. 23 shows what the equivalent canonical forms look like for better understanding of the encoder.

It can be seen that (C0,C2) is just a delayed parity version of the (C0,C1) code. Decoding this mode would only require a simple adjustment to a trellis decoder's state machine.

The (C1,C4) code has two problems. Firstly, it is a non systematic code. However, the M/H convolutional encoder has a benefit that the memory is reset to 0 at the start of every SCCC block system, putting the trellis into a known state. The C4 code is a feedforward methodology. Due to cancellation of terms, C4 is the sum of C0 with a delayed version of itself. As the starting state is known, C4 can be transformed to C0, which means that a systematic decoder for the (C1,C4) code can be constructed.

The second issue with the (C1,C4) code is that equivalent code bit C4 is placed into the Z1 bit of the output symbol while the C1 bit is placed in the stronger Z2 bit. This opens up the issue of using only the C4 bit to decode the signal, since this bit by itself will be weaker than having it in the Z2 bit. However, may not matter if it is assumed that the decoding is for R=1/2 in this mode; in this case the decoder will just be more strongly biased by the parity code.

FIG. 24—SCCC Block Mode Extension

In order to enable the additional R=1/2 modes described with respect to FIG. 23, these extended rate modes must be signaled. One part of the signaling may include modification to the TPC signaling. For example, the value '11' for the field 'SCCC_Block_Mode' shown in FIG. 18 may be used to mark a 2 bit 'SCCC_Block_Mode_Extension' field. This new field may be defined as shown in FIG. 24. For example, as shown, in the new field there may be provision for the R=1/2 convolutional coding modes derived from the R=1/4 (C0,C2),(C1,C4) mode as described with respect to FIG. 23.

FIG. 25—Convolutional Encoder Output Symbols (Bit Pairs)

In order for the TPC signaling modification described with respect to FIG. 24 to be effective, the convolutional encoder must define its output in a way consistent with this signaling. FIG. 25 shows one example of how the convolutional encoder of FIG. 6, as modified to derive the additional R=1/2 modes as described with respect to FIG. 23, may define its output in a way consistent with the signaling defined in FIG. 24.

Figure 26:
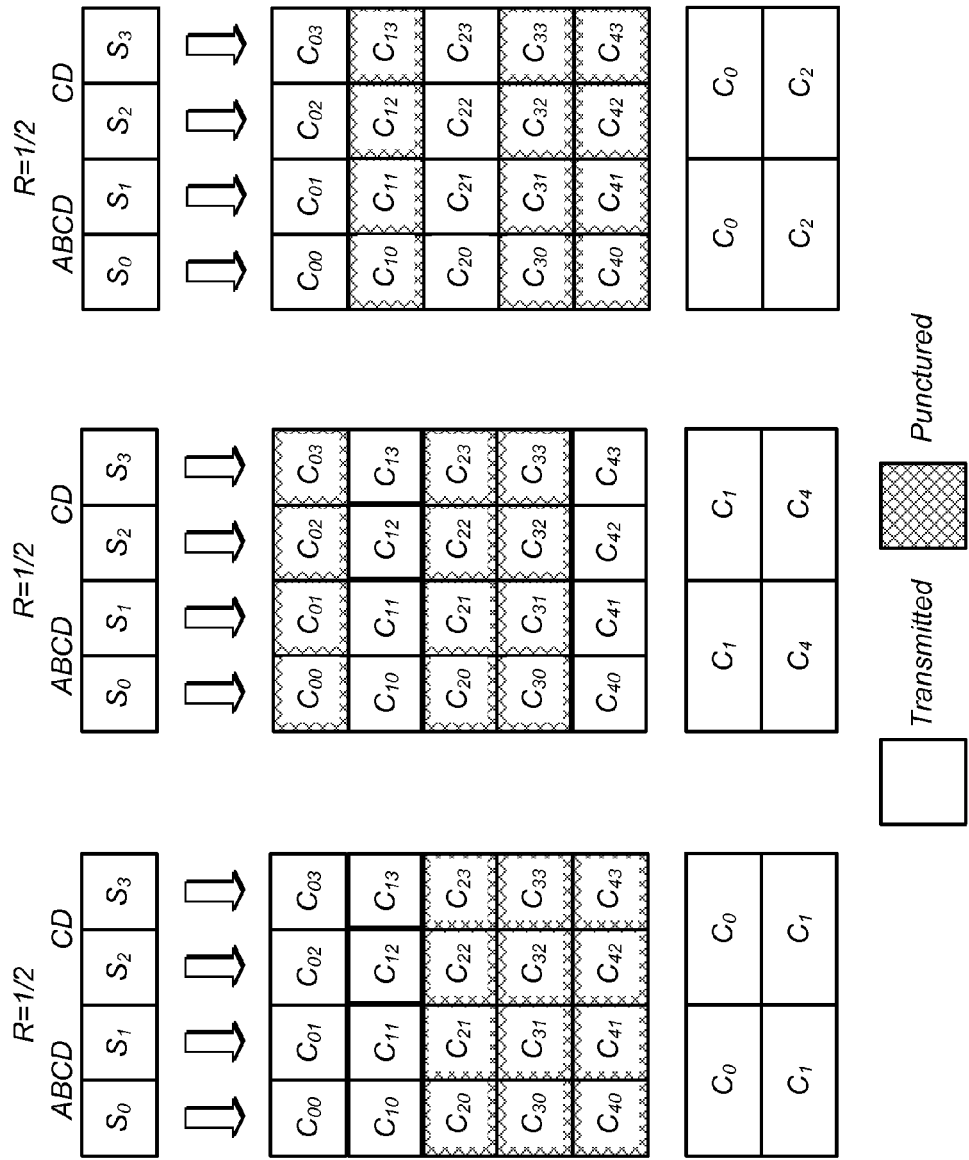
FIG. 26 illustrates stagger casted coding patterns according to one embodiment.

FIG. 26—Stagger Casting

As described with respect to FIG. 23, it is possible to split the R=1/4 code (C0,C2),(C1,C4) into two separate streams. Together with the R=1/2 code (C0, C1), these make up three partially complementary, partially overlapping, systematic (or effectively systematic in the case of (C1, C4)) R=1/2 coding patterns. These coding patterns are shown in FIG. 26. Since each coding pattern is systematic (or effectively systematic), the encoded audiovisual information may be retrieved by a mobile device from any of the three coding patterns, even if the other coding patterns are dropped or otherwise not received correctly. For example, if each pattern is transmitted in a separate stream (e.g., separated from the other coding patterns in time and/or frequency), even if one or more of the coding patterns are destroyed because of burst noise, a deep fade, and/or any other reason, at least one coding pattern may still be received. Even a single received systematic coding pattern may be sufficient for a mobile device to retrieve and present the encoded audiovisual data, if the signal to noise ratio for the received coding pattern is sufficient. On the other hand, if more than one stagger casted coding patterns are received by a mobile device, the coding of each coding pattern may build on the complementary coding of the other coding patterns to effectively form a more robust stream (e.g., a higher effective error correction coding rate), potentially enabling retrieval and presentation of the audiovisual information at a lower signal to noise ratio than would be possible if fewer of the coding patterns are received by the mobile device.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A system for transmitting audiovisual information in a wireless manner, the system comprising:
an input for receiving audiovisual information;
transmit logic coupled to the input, wherein the transmit logic is configured to generate a first stream and a separately transmittable second stream, wherein one or more of the first stream and the second stream comprise first audiovisual information, wherein one or more of the first stream and the second stream comprise first error correction coding information associated with the first audiovisual information, wherein one or more of the first stream and the second stream comprise control information indicating that the first stream and the second stream are associated;
a transmitter coupled to the transmit logic, wherein the transmitter is configured to transmit the first stream and the second stream in a wireless manner.

2. The system of claim 1,
wherein the first stream comprises the first audiovisual information and is usable in stationary reception conditions without the second stream;
wherein the second stream comprises the first error correction coding information and is configured for use in association with the first audiovisual information in mobile reception conditions.

3. The system of claim 1,
wherein the first stream comprises the first audiovisual information and the first error correction coding information and is usable in stationary reception conditions without the second stream;
wherein the second stream comprises second error correction coding information and is configured for use in association with the first audiovisual information in mobile reception conditions.

4. The system of claim 3,
wherein the second error correction coding information is a different type of error correction coding information than the first error correction coding information.

5. The system of claim 3,
wherein the second error correction coding information is a same type of error correction coding information as the first error correction coding information, wherein the second error correction coding information is complementary to the first error correction coding information.

6. The system of claim 1,
wherein the first stream comprises the first audiovisual information and the first error correction coding information, wherein the second stream comprises second audiovisual information and second error correction coding information associated with the second audiovisual information, wherein the first audiovisual information and the second audiovisual information are configured for use together.

7. The system of claim 6,
wherein at least a portion of the second audiovisual information is the same audiovisual information as at least a portion of the first audiovisual information;
wherein the first error correction coding information is different than the second error correction coding information.

8. The system of claim 1,
wherein the first stream and the second stream are generated in a manner configured for transmission at different times and/or at different frequencies, wherein the transmitter is configured to transmit the first stream and the second stream at different times and/or at different frequencies, and wherein the control information indicates that the first stream and the second stream are transmitted at different times and/or at different frequencies.

9. A method for transmitting audiovisual information in a wireless manner, the method comprising:

generating a first plurality of packets, wherein the first plurality of packets comprise first audiovisual information;

generating a second plurality of packets, wherein the second plurality of packets comprise first error correction coding information for the first audiovisual information;

generating control information, wherein the control information indicates that the first error correction coding information is associated with the first audiovisual information;

transmitting the first plurality of packets, the second plurality of packets, and the control information in a wireless manner;

wherein the first plurality of packets and the second plurality of packets are transmitted one or more of: 1) separated in time; or 2) separated in frequency, wherein the control information indicates that the first plurality of packets and the second plurality of packets are transmitted one or more of: 1) separated in time; or 2) separated in frequency.

10. A non-transitory computer accessible memory medium storing program instructions for configuring audiovisual information for wireless transmission, wherein the program instructions are executable to:

receive first audiovisual information;

generate a first stream and a separately transmittable second stream associated with the first stream based on the first audiovisual information, wherein one or more of the first stream and the second stream comprise the first audiovisual information, wherein one or more of the first stream and the second stream comprise first error correction coding information associated with the first audiovisual information, wherein one or more of the first stream and the second stream comprise control information indicating that the first stream and the second stream are associated;

wherein the first stream and the second stream are configured for wireless transmission.

11. A wireless device configured to wirelessly receive audiovisual information, the wireless device comprising:

a receiver configured to receive a first stream and a separate second stream in a wireless manner, wherein one or more of the first stream and the second stream comprise first audiovisual information, wherein one or more of the first stream and the second stream comprise first error correction coding information associated with the first audiovisual information, wherein one or more of the first stream and the second stream comprise control information indicating that the first stream and the second stream are associated;

receiver logic coupled to the receiver, wherein the receiver logic is configured to:

associate the first stream and the second stream based on the control information indicating that the first stream and the second stream are associated;

process the first audiovisual information using the first error correction coding information, wherein after processing the first audiovisual information is configured for presentation.

12. The wireless device of claim 11, wherein the first stream comprises the first audiovisual information and is usable in stationary reception conditions without the second stream;

wherein the second stream comprises the first error correction coding information and is configured for use in association with the first audiovisual information in mobile reception conditions.

13. The wireless device of claim 11, wherein the first stream comprises the first audiovisual information and the first error correction coding information and is usable in stationary reception conditions without the second stream;

wherein the second stream comprises second error correction coding information and is configured for use in association with the first audiovisual information in mobile reception conditions;

wherein the receiver logic is further configured to process the first audiovisual information using the second error correction coding information.

14. The wireless device of claim 13, wherein the second error correction coding information is a different type of error correction coding information than the first error correction coding information.

15. The wireless device of claim 13, wherein the second error correction coding information is a same type of error correction coding information as the first error correction coding information, wherein the second error correction coding information is complementary to the first error correction coding information.

16. The wireless device of claim 11, wherein the first stream comprises the first audiovisual information and the first error correction coding information, wherein the second stream comprises second audiovisual information and second error correction coding information associated with the second audiovisual information, wherein the first audiovisual information and the second audiovisual information are configured for use together, wherein the receive logic is further configured to:

process the first audiovisual information and the second audiovisual information using the first error correction coding information and the second error correction coding information.

17. The wireless device of claim 16, wherein at least a portion of the second audiovisual information is the same audiovisual information as at least a portion of the first audiovisual information;

wherein the first error correction coding information is different than the second error correction coding information.

18. The wireless device of claim 11, wherein the receiver is configured to receive the first stream and the second stream at different times and/or at different frequencies, wherein the control information indicates that the first stream and the second stream are transmitted at different times and/or at different frequencies, wherein the receive logic is further configured to associate the first stream and the second stream based on the control information indicating that the first stream and the second stream are transmitted at different times and/or at different frequencies.

19. A method for receiving audiovisual information in a wireless manner, the method comprising:

receiving a first plurality of packets in a wireless manner, wherein the first plurality of packets comprise first audiovisual information;

receiving a second plurality of packets in a wireless manner, wherein the second plurality of packets comprise first error correction coding information for the first audiovisual information;

receiving control information in a wireless manner, wherein the control information indicates that the first error correction coding information is associated with the first audiovisual information;

wherein the first plurality of packets and the second plurality of packets are received one or more of: 1) separated in time; or 2) separated in frequency, wherein the control information indicates that the first plurality of packets and the second plurality of packets are transmitted one or more of: 1) separated in time; or 2) separated in frequency;

associating the first error correction coding information and the first audiovisual information based on the control information indicating that first error correction coding information is associated the first audiovisual information and that the first plurality of packets and the second plurality of packets are transmitted one or more of: 1) separated in time; or 2) separated in frequency;

processing the first audiovisual information using the associated first error correction coding information, wherein after processing the first audiovisual information is configured for presentation.

20. A non-transitory computer accessible memory medium storing program instructions for a wireless device to receive and process audiovisual information, wherein the program instructions are executable to:

receive a first stream and a separate second stream associated with the first stream, wherein one or more of the first stream and the second stream comprise first audiovisual information, wherein one or more of the first stream and the second stream comprise first error correction coding information associated with the first audiovisual information, wherein one or more of the first stream and the second stream comprise control information indicating that the first stream and the second stream are associated;

associate the first stream and the second stream based on the control information indicating that the first stream and the second stream are associated;

process the first audiovisual information using the first error correction coding information, wherein after processing the first audiovisual information is configured for presentation.

* * * * *